US006000128A

United States Patent [19]

Umeno et al.

[11] Patent Number: 6,000,128

[45] **Date of Patent: *Dec. 14, 1999**

[54] PROCESS OF PRODUCING A MULTI-LAYERED PRINTED-COIL SUBSTRATE

[75] Inventors: Tohru Umeno; Naoki Arai, both of Osaka, Japan

[73] Assignee: Sumitomo Special Metals Co., Ltd., Osaka, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/921,690

[22] Filed: Sep. 2, 1997

Related U.S. Application Data

[63] Continuation of application No. 08/492,817, Jun. 20, 1995, abandoned.

[30] Foreign Application Priority Data

Jun. 21, 1994 [JP] Japan .................................... 6-138946

[51] Int. Cl.$^{6}$ ........................................................ H05K 3/02

[52] U.S. Cl. ................................ 29/846; 29/830; 29/842; 29/605; 29/606; 336/200

[58] Field of Search .................................... 29/602.1, 605, 29/606, 608, 830, 842, 846; 303/119.3; 336/200

[56] References Cited

U.S. PATENT DOCUMENTS

| | | | |
|---|---|---|---|
| 3,798,059 | 3/1974 | Astle et al. | 29/608 |
| 3,939,450 | 2/1976 | Donnelly | 336/90 |
| 4,342,143 | 8/1982 | Jennings | 29/602.1 |
| 4,547,961 | 10/1985 | Bokil et al. | 29/602.1 |
| 4,604,160 | 8/1986 | Murakami et al. | 29/846 X |
| 4,772,864 | 9/1988 | Otto et al. | 33/238 |
| 4,873,757 | 10/1989 | Williams | 29/602 |
| 5,012,571 | 5/1991 | Fujita et al. | 29/605 X |
| 5,173,678 | 12/1992 | Bellows et al. | 29/606 X |
| 5,402,098 | 3/1995 | Ohta et al. | 336/200 |
| 5,452,948 | 9/1995 | Cooper et al. | 303/119.3 |

FOREIGN PATENT DOCUMENTS

| | | | |
|---|---|---|---|
| 0 267 108 | 5/1988 | European Pat. Off. . | |
| 0 413 848 | 2/1991 | European Pat. Off. . | |
| 39-6921 | 5/1964 | Japan . | |
| 41-10524 | 5/1966 | Japan . | |
| 48-51250 | 7/1973 | Japan . | |
| 0089819 | 5/1983 | Japan | 29/602.1 |
| 61-74311 | 4/1986 | Japan . | |
| 61-75510 | 4/1986 | Japan . | |
| 4-88614 | 3/1992 | Japan . | |
| 4-103612 | 9/1992 | Japan . | |
| 4-15512 | 9/1992 | Japan . | |
| 4-294508 | 10/1992 | Japan . | |
| 5-291062 | 11/1993 | Japan . | |
| 6-163266 | 6/1994 | Japan . | |

*Primary Examiner*—Lee Young
*Assistant Examiner*—Rick Kiltae Chang
*Attorney, Agent, or Firm*—Burns, Doane, Swecker & Mathis, LLP

[57] ABSTRACT

A process of producing a multi-layered printed-coil substrate as a planar magnetic component for use as a transformer or a choke in a switched mode power supply circuit, etc. in which several types of printed-coil substrates having individually different coil patterns are prepared, some of them are selected depending upon the desired characteristics of planar magnetic component, and the selected substrates are layered to obtain a multi-layered printed-coil substrate. A printed-coil component, wherein pin terminals erected on insulating bases are inserted through through-holes formed in the printed-coil substrate having patterned coils in a single or several layers and pin terminals are soldered to the through-holes.

10 Claims, 27 Drawing Sheets

Vcc :POWER TERMINAL
Vref:REFERENCE VOLTAGE TERMINAL
F/B :FEEDBACK VOLTAGE TERMINAL
G :EARTH TERMINAL
OCP :OVERCURRENT PROTECTION TERMINAL
Pulse:MOSFET DRIVE PULSE TERMINAL FIG. 7
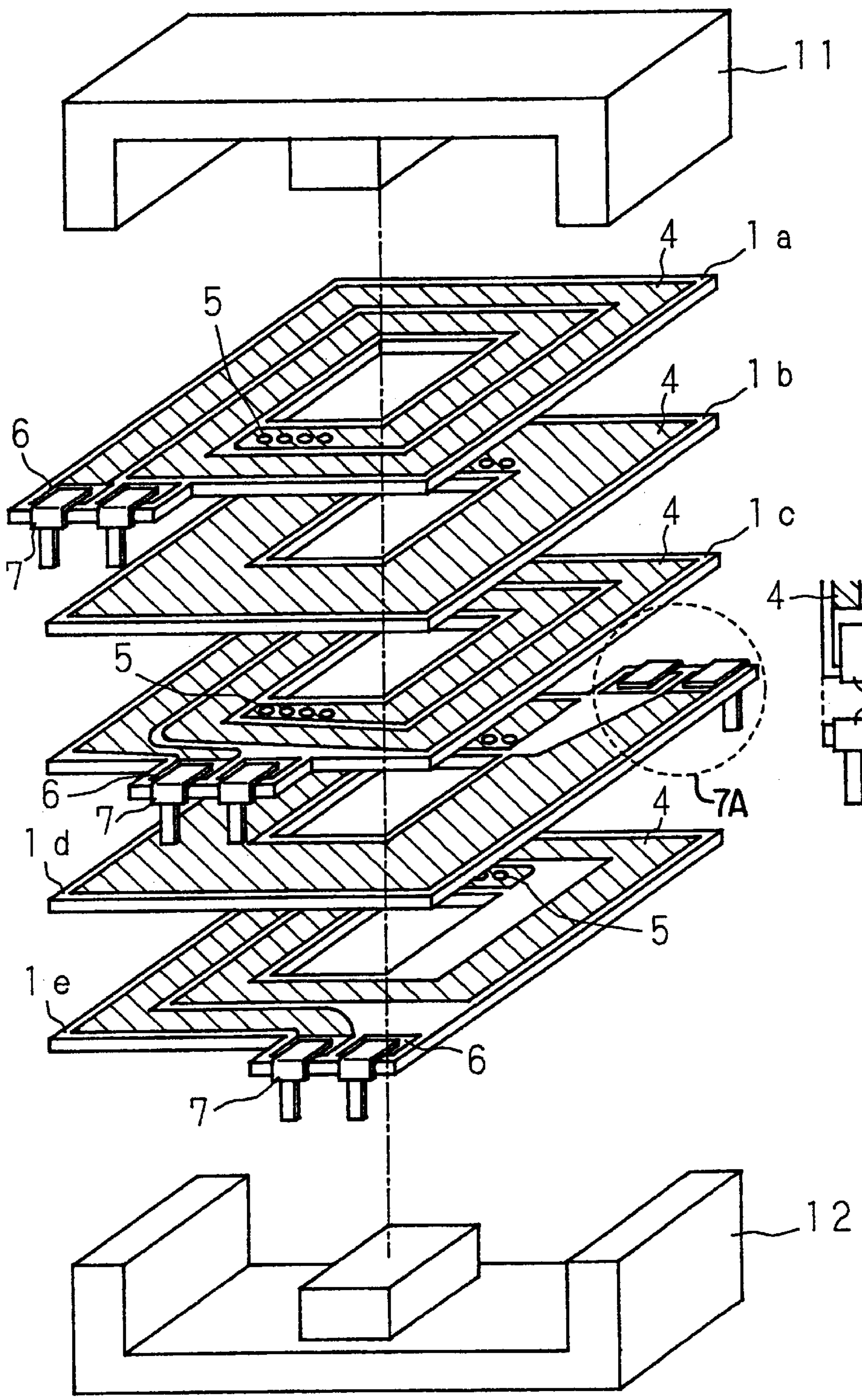
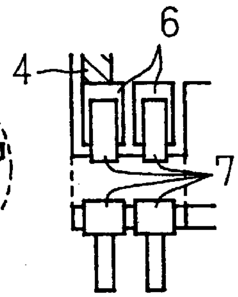
FIG.7A FIG. 8
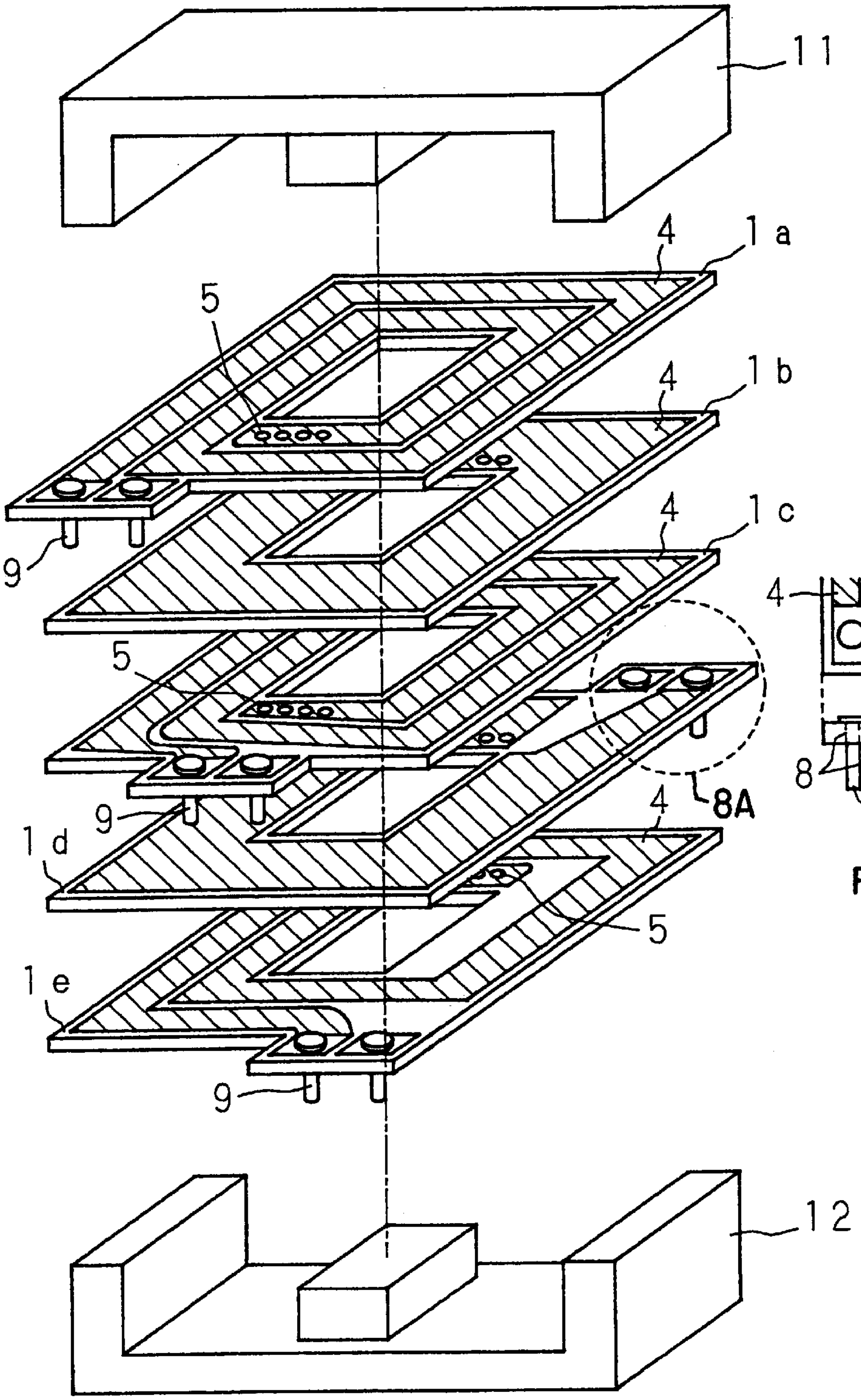
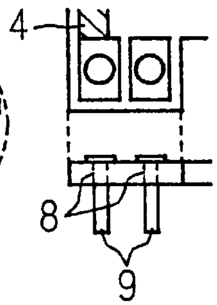
FIG. 8A

SOW: START OF WINDING
EOW: END OF WINDING

PROCESS OF PRODUCING A MULTI-LAYERED PRINTED-COIL SUBSTRATE

This application is a continuation, of application Ser. No. 08/492,817, filed Jun. 20, 1995 abandoned.

BACKGROUND OF THE INVENTION

1. Field of the Invention

The present invention relates to a multi-layered printed-coil substrate for use as planar magnetic components, wherein the multi-layered printed-coil substrate includes a single or a plurality of substrates which has patterned coils.

2. Description of the Background Art

Wound magnetic components are known in the art and in common use as transformers and choke coils used in the switched mode power supply circuits and the like. The known wound magnetic component is composed of a bobbin having lead terminals, the bobbin being wound with an enamel wire or the like. This type of magnetic components are advantageous in that the number of turns and turn ratios can be readily changed so as to obtain an optimum transformer ratio, thereby facilitating the designing and developing of circuits, especially the manufacturing of transformers having an optimum transformer ratio.

In general, the industry is in a strong need for recuction in the size and weight of electronic devices, and such demands are reflected in the minimizing of circuit components. As one of the proposals for meeting such demands, planar magnetic components have been developed instead of the conventional wound magnetic components. Examples of planar magnetic components are disclosed in Japanese Patent Publication Nos. 39-6921, 41-10524, and Laid-Open Publication No. 48-51250. The planar magnetic component is not fabricated by winding a wire into a coil but, for example, a flat insulating substrate is used on which a conductive pattern is formed with a thin film in a letter-U form or a spiral form. In this way a printed-coil substrate is obtained. A single substrate or several substrates are layered into a unit which is then sandwiched between magnetic cores. However, the number of turns is limited because of the restricted space on the substrate. To overcome this limitation, it is required that several printed-coil substrates are layered into a single unit.

Planar magnetic components are advantageous in that the size and height can be minimized, and the leakage inductance is minimized because of an increased area for interlinkage of the magnetic flux thereby to strengthen coupling between the primary and secondary windings, and the minimized copper loss due to skin effect. In addition, the coil is formed by etching which is more stable than the wire winding, thereby enhancing productivity and maintaining quality control. Among these advantages the high coupling between the primary and secondary windings and the restraint of copper loss will be more appreciated when the components are used under a high frequency current. In the field of switched mode power supply circuit where the use of high frequency current is becoming more and more popular, planar magnetic components call the industry's attention.

FIG. 1 shows examples disclosed in Japanese Patent Laid-Open Publications Nos. 61-74311 and 61-75510, for example. A wiring substrate 41 is composed of layered insulating sheets each having coil patterns 45 formed thereon. The wiring substrate 41 as a whole constitutes a multi-layered printed-coil substrate used for a transformer. The wiring substrate 41 is provided with through-holes 42 through which terminals 43 in the form of pins (hereinafter "pin terminals") are inserted and soldered thereto, thereby ensuring that the coil patterns 45 on one substrate and another are electrically connected. One end of each pin terminal 43 is extended as shown in FIG. 1C and used as a connector to an external conductor (not shown). The wiring substrate 41 is sandwiched between a pair of split cores 44 and 46. In this way a magnetic circuit is completed in the transformer.

FIG. 2 shows another example of planar magnetic component which is disclosed in Japanese Utility Model Laid-Open Publication No. 4-103612. A coil pattern 52 is formed in a spiral form on a wiring substrate 51. The wiring substrate 51 is provided with three apertures 53, 54 and 55. A pair of ferrite cores 56 and 57 are prepared; the core 56 is provided with three projections adapted for insertion through the apertures 53, 54 and 55 of the wiring substrate 51. The core 57 is provided with recesses for receiving the projections of the core 56. In this way a magnetic circuit for transformers is formed.

FIGS. 3 and 4 show further examples which are disclosed in Japanese Utility Model Laid-Open Publication No. 4-105512, Patent Laid-Open Publications Nos. 5-291062 and 6-163266. The illustrated thin-type transformer includes a multi-layered printed-coil substrate 62 placed on a base 63 which is provided with pin terminals 65 each of which includes a vertically extending portion 65*a* and a horizontally extending portion 65*b*. The vertically extending portions 65*a* are inserted through through-holes 66 in the multi-layered printed-coil substrate 62 and soldered thereto so as to effect electrical connection. The multi-layered printed-coil substrate 62 is sandwiched between an I-shaped core 64 and an E-shaped core 61, thereby forming a complete planar magnetic component. The finished component is connected to an external conductor through the horizontally projecting portions 65*b*.

The known planar magnetic components have advantages pointed out above, but on the other hand, they inherently have the difficulty of changing the number of turns and ratios of winding, and when these changes are wanted, a fresh printed-coil substrate must be fabricated after a new coil pattern is designed. This involves a time- and money-consuming work. Eventually, the components must be used where the number of turns and ratio of winding are fixed. The advantages inherent in planar magnetic component are not fully utilized.

The example shown in FIG. 1 has difficulty in enabling the pin terminals 43 to align with the through-holes 42 and vertically position therein. This aligning work is time-consuming, which is reflected in the production cost.

As far as the aligning is concerned, the examples of FIGS. 3 and 4 are more advantageous than the example of FIG. 1 because of using the base 63 having pin terminals 65 uprightly fixed in alignment with the through-holes 66. The use of the base 63 can reduce the number of producing steps. On the other hand, the complicated base 63 is costly, so that the whole production cost cannot be reduced. For the purpose of mass-production, one way is to standardize the base 63 in the shape (the size, the pin terminal pitches, the number of pin terminals) but this is contradictory to users' demand. Users want to have a variety of bases even in a small quantity in accordance with required magnetic characteristics. If the bases are standardized in one or two fixed models, the range of applications will be restricted. The examples of FIGS. 3 and 4 lack the freedom of designing the configuration of bases, and there is no choice but to use expensive bases 63.

In the example shown in FIG. 2 the coil pattern and the external conductor are constituted on the same substrate, thereby requiring no terminal base or pin terminal. This example is advantageous in that processing steps can be saved but a disadvantage is the lack of freedom of design because of the requirement that the number of coil patterns and the thickness of copper foils must be the same as those of the external conductor.

SUMMARY OF THE INVENTION

The present invention is directed to solve the problems discussed above, and a principal object of the present invention is to provide a multi-layered printed-coil substrate, a printed-coil substrate used in producing the multi-layered printed-coil substrate and a process of producing the multi-layered printed-coil substrate, thereby providing planar magnetic components which secure the freedom of design so as to meet various needs without increasing the production cost.

One object of the present invention is to provide a process of producing a multi-layered printed-coil substrate by layering a predetermined number of printed-coil substrates, the process comprising the steps of preparing several types of printed-coil substrates having individually different coil patterns; selecting desired printed-coil substrates from the prepared substrates, and layering the selected printed-coil substrates to form a multi-layered printed-coil substrate.

Preferably, the types of prepared printed-coil substrates are different from each other in at least one of the factors including the number of turns, the coil shape, the coil width and the coil thickness.

Preferably, each of the prepared printed-coil substrates is provided with through-holes for electrical connection between one and the next of the selected printed-coil substrates. In addition, each of the prepared printed-coil substrates may be provided with connectors for electrical connection between the selected printed-coil substrates and an external conductor.

Another object of the present invention is to provide a process of producing a multi-layered printed-coil substrate by layering printed-coil substrates, the process comprising the steps of preparing several types of printed-coil substrates having individually different coil patterns; selecting desired first printed-coil substrates from the prepared substrates; layering the selected first printed-coil substrates to obtain a prototype multi-layered printed-coil substrate; forming second printed-coil substrates having characteristics demonstrated through the prototype multi-layered printed-coil substrate; and layering the second printed-coil substrates to obtain a commercial multi-layered printed-coil substrate having desired characteristics to meet various needs.

Preferably, the multi-layered printed-coil substrate includes a connector for electrical connection to an external conductor, wherein each of the printed-coil substrates is provided with through-holes, and is supported by an insulating base having pin terminals erected thereon for insertion into the through-holes in the substrates, thereby effecting electrical connection between the pin terminals and the through-holes.

A still further object of the present invention is to provide a group of printed-coil substrates for use in producing a multi-layered printed-coil substrate, the substrates in the group being different from each other in at least one of the factors including the number of turns, the coil shapes, the coil width and the coil thickness.

Preferably, the group of printed-coil substrates selected for producing a multi-layered printed-coil substrate may include ones whose numbers of turns are expressed in an integer and/or in a decimal fraction.

The above and further objects and features of the invention will more fully be apparent from the following detailed description with the accompanying drawings.

BRIEF DESCRIPTION OF THE DRAWINGS

FIG. 7 is an exploded perspective view showing an example embodying the present invention;

FIG. 7A is an enlarged view of a portion of one of the substrates shown in FIG. 7.

FIG. 8 is an exploded perspective view showing another example embodying the present invention;

FIG. 8A is an enlarged view of a portion of one of the substrates shown in FIG. 8;

DETAILED DESCRIPTION OF PREFERRED EMBODIMENTS

Figures 5A, 5B:
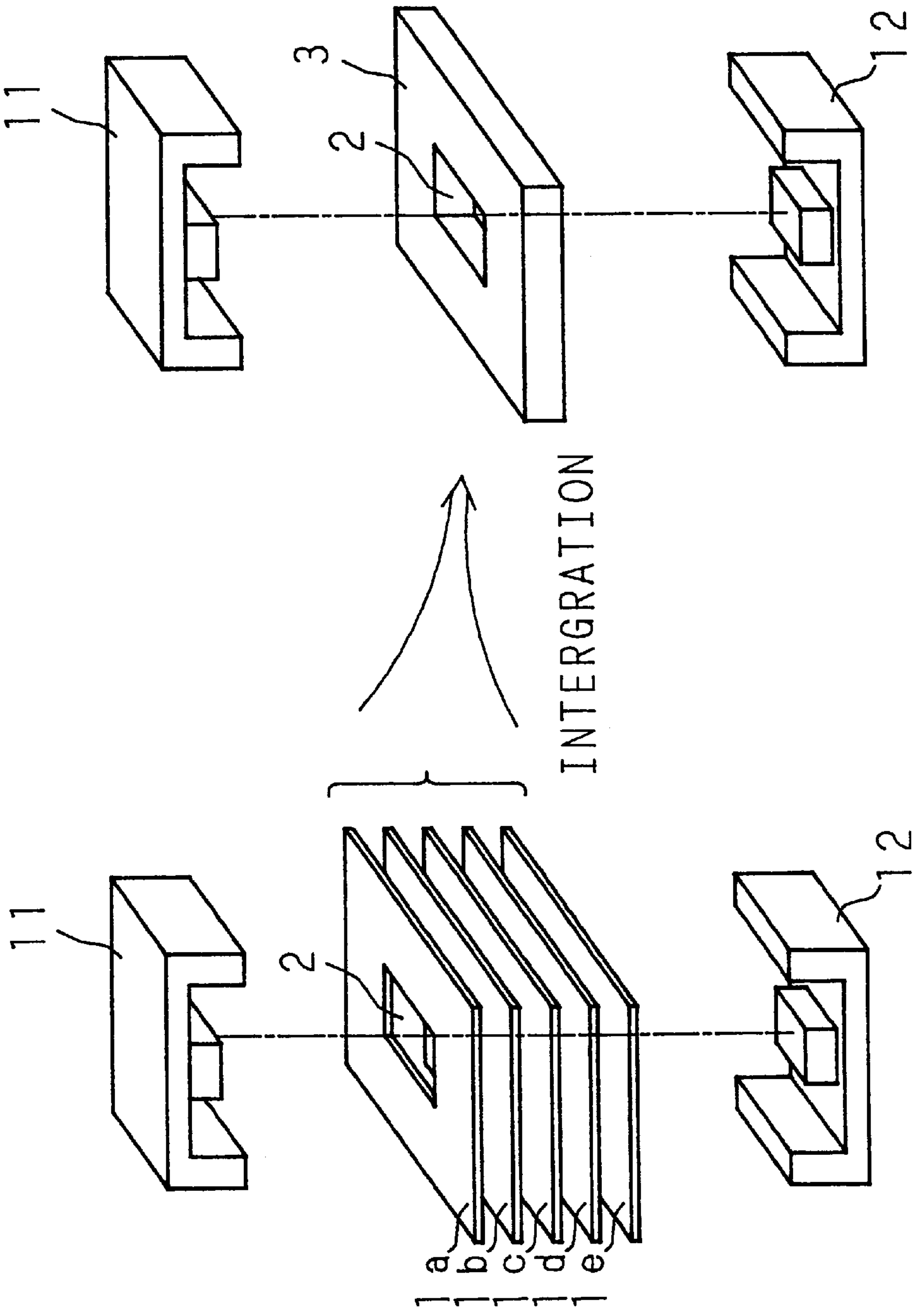
FIGS. 5A and 5B are exploded perspective views exemplifying the steps of producing a multi-layered printed-coil substrate according to the present invention.

The present invention will be described by way of examples by reference to the drawings. In FIGS. 5A and 5B, a plurality of printed-coil substrates are prepared wherein each substrate has a conductive coil having different turns printed in a predetermined pattern on one face or on both faces. From the prepared substrates desired substrates (in the illustrated embodiment, five substrates 1*a* to 1*e*) are selected, and placed in layers as shown in FIG. 5A. The pile is clamped by cores 11 and 12 on top and bottom. Each core includes projections in the middle and on each edges, having an E-shape in cross-section. Each printed-coil substrate 1*a* to 1*e* has a rectangular aperture 2 which receives the middle projection of each core 11 and 12.

The substrates 1*a* to 1*e* are integrated into a single body 3, hereinafter referred to as "multi-layered printed-coil substrate 3", and the cores 11 and 12 are fixed to the multi-layered printed-coil substrate 3 by inserting the middle projections thereof in its apertures 2 until both projections come into abutment with each other. In this way a planar magnetic component is finished.

Now, an example of applications will be described by reference to FIG. 6. The exemplary circuit is a forward type switched mode power supply circuit which uses a multi-layered printed-coil substrate of the present invention. The multi-layered printed-coil substrate of the invention is used as a transformer 13 and a choke 14. The exemplary switched mode power supply is responsive to an input voltage of 36 to 72 V. An output voltage is divided by a resistor, and amplified by comparison with a reference voltage of a variable Zener diode 19. Then it is inputted to a feed-back voltage terminal for a PWM (Pulse Width Modulation) IC 15 through a photo-diode 17 and a photo-transistor 18. In general, in a forward type switched mode power supply circuit the output voltage and the duty ratio (time ratio of on-time period to pulse period) of the MOSFET switch 16 are mutually proportional. The PWM IC 15 controls the duty ratios of pulses to the MOSFET in accordance with the voltages at the feed-back voltage terminal, thereby maintaining the output voltage at a predetermined value. At the switched mode power supply circuit as the output voltage rises (falls), the photo-diode 17 increases (decreases) brightness, thereby causing the voltage at the feed-back voltage terminal connected to the emitter of the photo-transistor 18 to rise (fall). As a result, the duty ratio of the MOSFET driving pulses of the PWM IC 15 lowers (rises), thereby regulating the output voltage to a determined value.

In order to produce magnetic components used for the transformer 13 and the choke 14, six types of printed-coil substrates each having different number of turns were prepared. Each type of substrate had conductive patterned coils and having the same on each face. The number of turns on each face of the six types of substrates are summarized as follows:

L1: 2 turns L2: 3 turns L3: 4 turns

L4: 5 turns L5: 6 turns L6: 7 turns

Since it is required to limit the height of the planar magnetic component including the cores to 5 mm or less, the maximum number of printed-coil substrates is six. Table 1 shows examples of selected substrates for the transformer 13 and the choke 14. The number of substrates are five as shown in FIG. 5A. The 1st to 5th substrates in Table 1 correspond to the substrates 1*a* to 1*e* in FIG. 5A.

TABLE 1

| | Transformer (13) | | Choke (14) | |
|---|---|---|---|---|
| Substrates | primary/secondary | substrate | primary/secondary | |
| 1st (1a) | primary | L 5 | secondary | L 1 |
| 2nd (1b) | secondary | L 1 | primary | L 6 |
| 3rd (1c) | primary | L 5 | secondary | L 1 |
| 4th (1d) | secondary | L 2 | primary | L 6 |
| 5th (1e) | primary | L 5 | secondary | L 1 |

In the illustrated example the primary coil and secondary coil are alternately layered so as to strengthen the coupling between the primary and secondary windings.

Figure 6:
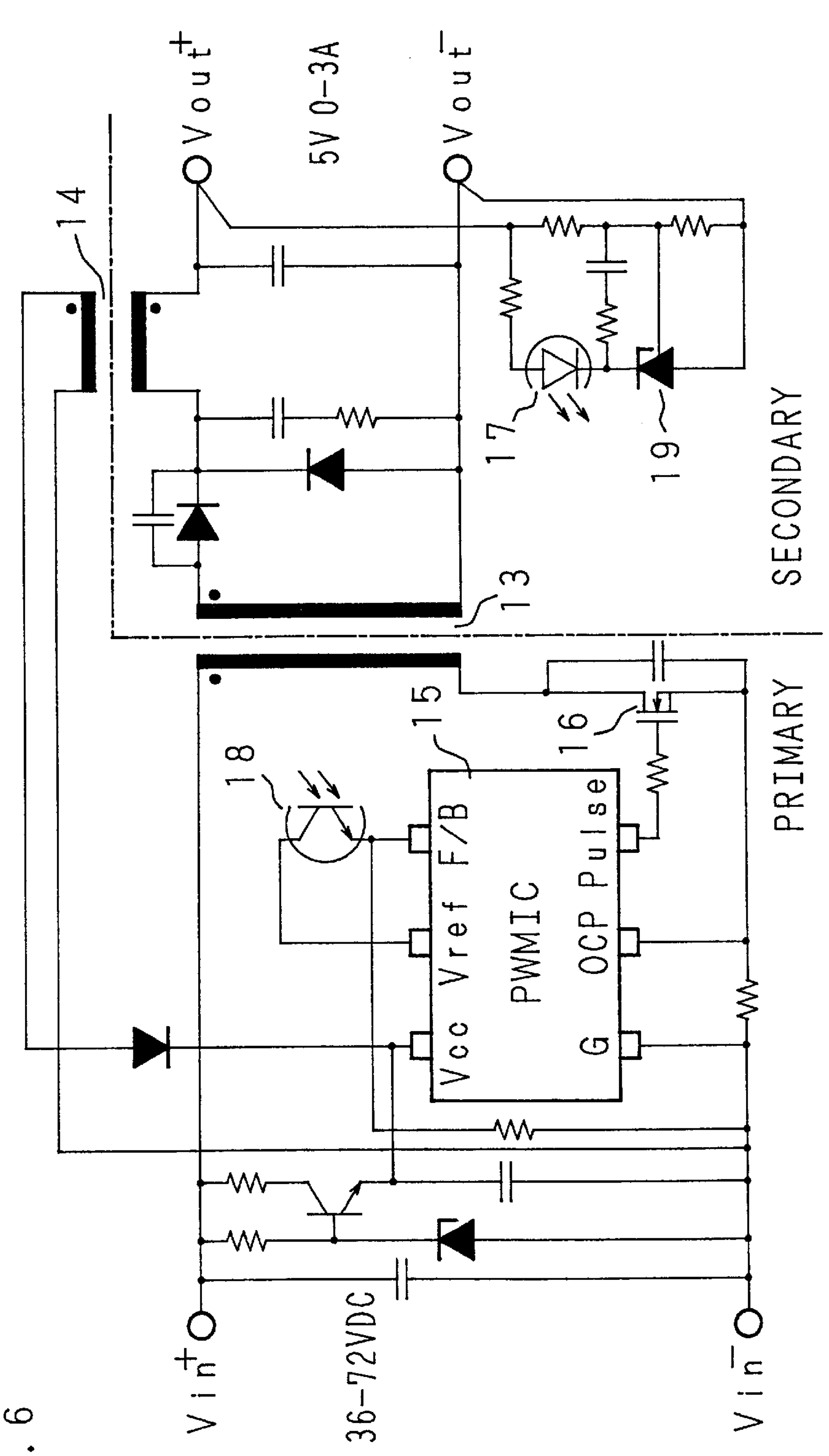
FIG. 6 is a circuit diagram of a switched mode poser supply.

The planar magnetic components obtained by integrating the five substrates 1*a* to 1*e* shown in Table 1 and sandwiching them between the cores 11 and 12 were used in the transformer 13 and the choke 14 with the switching circuit shown in FIG. 6. It was found that the efficiency of the switched mode power supply remarkably increased by as high as 85%. This is greatly due to the high coupling between the primary and secondary windings which improves the performance of a planar magnetic component.

In general, a 10-layered printed-coil substrate costs ¥500,000.—to ¥600,000.—and takes at least a month to make it. In addition, it is necessary to change the number of turns several times for use in transformers and chokes. Under the conventional practice several types of multi-layered printed-coil substrates having particular number of turns and turn ratios are prepared and stored, and when necessary, an appropriate prototype is selected in accordance with the desired specification. This practice limits the range of applicability of planar magnetic components to limited industrial fields, and therefore, the advantages of planar magnetic components cannot be fully utilized. Advantageously, according to the present invention, a variety of printed-coil substrates having different number of turns can be selected as desired from a stock according to use. If they are intended for use in equipment subjected to changes in the input and output voltages at the switched mode power supply, the printed-coil substrates of the present invention can be readily adjusted to the needs, thereby securing the freedom of design. A further advantage is that the performance test can be done in a relatively short time and the production cost is saved. In the illustrated example, the same number of turns is patterned on each face. It is possible to differ the number of turns between both faces, and to form a coil pattern one face alone. Furthermore, it is possible to combine two types of printed-coil substrates having coil patterns on one face and on both faces.

Various modifications are possible, for example, by changing the configuration of coiling, the width and/or thickness of the printed-coil. Substrates having modified coils are prepared and stored for selection at the assembly process. This secures the freedom to manufacture multi-layered printed-coil substrates to various requirements.

Next, referring to FIG. 7 and FIG. 7A, the manner of electrical connection of the printed-coil substrates will be described:

In FIG. 7, the printed-coil substrates 1*a* to 1*e* each having predetermined patterns of coils 4 on both faces and through-holes 5 for electrical connection between both faces. Each substrate 1*a* to 1*e* has a terminal 6 on an extruded portion in the short side and a downward-projecting clip-lead 7 detachably fixed to the terminal 6 as seen in FIG. 7 and FIG. 7A. The clip-leads 7 are used not only for electrical connection between the printed-coil substrates but also for electrical connection to an external conductor through electrical connection to the patterns formed in a mounting substrate.

Referring to FIG. 8 and FIG. 8A, wherein like reference numerals designate like elements and components to those in FIG. 7 and FIG. 7A, a modified version will be described:

This example is different from the example shown in FIG. 7 and FIG. 7A in that the short side has an extruded part in which another through-holes 8 supporting pin-terminals 9 are formed. The pin-terminals 9 function in the same manner as the clip-leads 7.

Figure 9A:
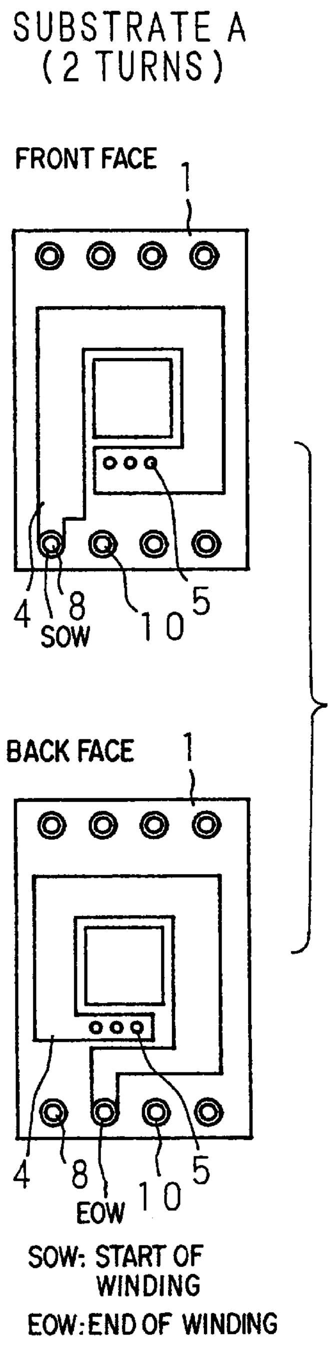
FIGS. 9A, 9B and 9C are is a plane views showing an example of printed-coil substrates as a constituent of the multi-layered printed-coil substrate.
Figure 9B:
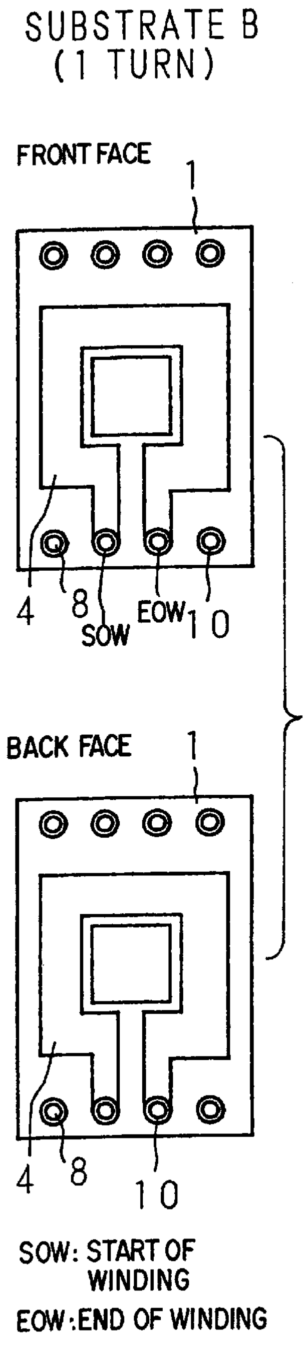
Figure 9C:
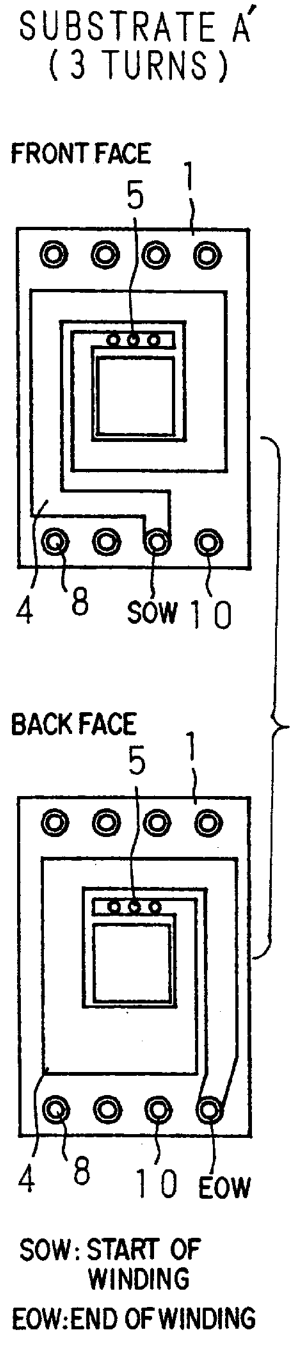

In general, unlike wound magnetic components planar magnetic components become more costly in proportion to the number of printed-coil substrates to be used, especially in the initial costs incurred in designing and preparing patterning films for etching. If a reduction in the production cost is wanted on condition that the tested performances of multi-layered printed-coil substrates are maintained, the following method is possible according to the present invention:

First, reference will be made to the types of printed-coil substrates. FIGS. 9A, 9B and 9C shows three types of substrates A, B and A' each having patterned coils on both faces and having four terminals at each side of the face. The back face is opposite to the front face. The reference numerals 4 and 5 denote a coil having a predetermined pattern, and through-holes 5 which connect one of the faces to another, respectively. Each substrate is provided with four pin pads 10 along the opposite sides, each of the pin pads 10 including a through-hole 8, through which a pin terminal is inserted for electrical connection between the substrates.

These substrates can be classified according to which of the through-holes 8 corresponds to a starting end and an ending end of winding. More particularly, in the top face of the substrate A (FIG. 9A) the 1st through-hole 8 in the bottom row corresponds to the starting end of the coil winding, and the 2nd through-hole 8 in the same row corresponds to the ending end of the coil 4. Likewise, in the substrate B (FIG. 9B) the 2nd through-hole from the left in the bottom row corresponds to the starting end of winding, and the 3rd through-hole 8 in the same row corresponds to the ending end of winding. In the substrate A' the 3rd through-hole in the bottom row corresponds to the starting end of winding and the 4th thorough-hole in the same row corresponds to the ending end of winding. The substrate A' can be obtained by turning the substrate A upside down, and therefore they are substantially the same. When four terminals are provided at each side of the face, the printed-coil substrate can have two types, that is, the substrates A and B, and printed-coil substrates having several turns are prepared for each type. An example is shown in Table 2 in which the substrates have various number of turns ranging from 1 to 6:

TABLE 2

| Substrates | Type | Number of Turns |
|---|---|---|
| A1 | A | 1 |
| A2 | A | 2 |
| A3 | A | 3 |
| A4 | A | 4 |
| A5 | A | 5 |
| A6 | A | 6 |
| B1 | B | 1 |
| B2 | B | 2 |
| B3 | B | 3 |
| B4 | B | 4 |
| B5 | B | 5 |
| B6 | B | 6 |

Figure 10:
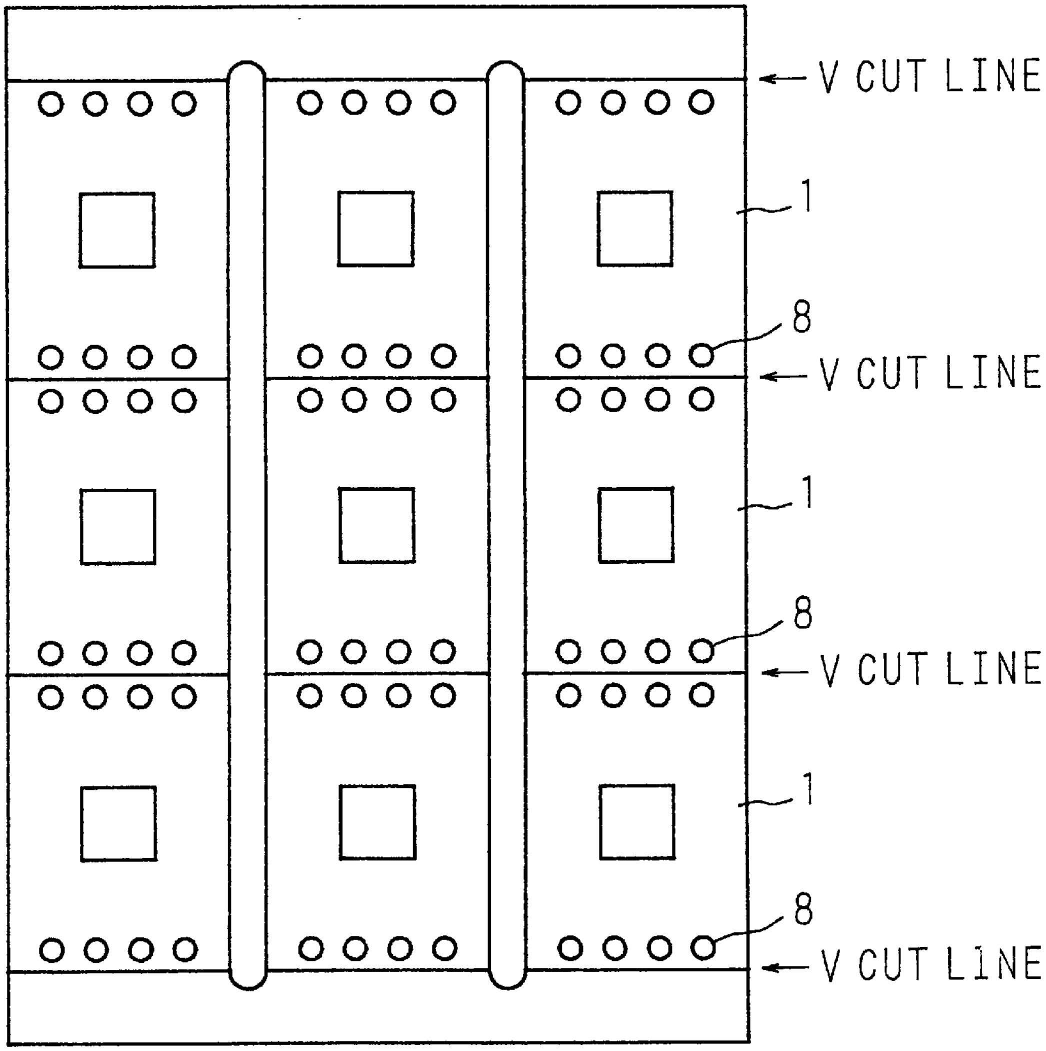
FIG. 10 is a plane view showing several printed-coil substrates formed in a single sheet.
Figure 11:
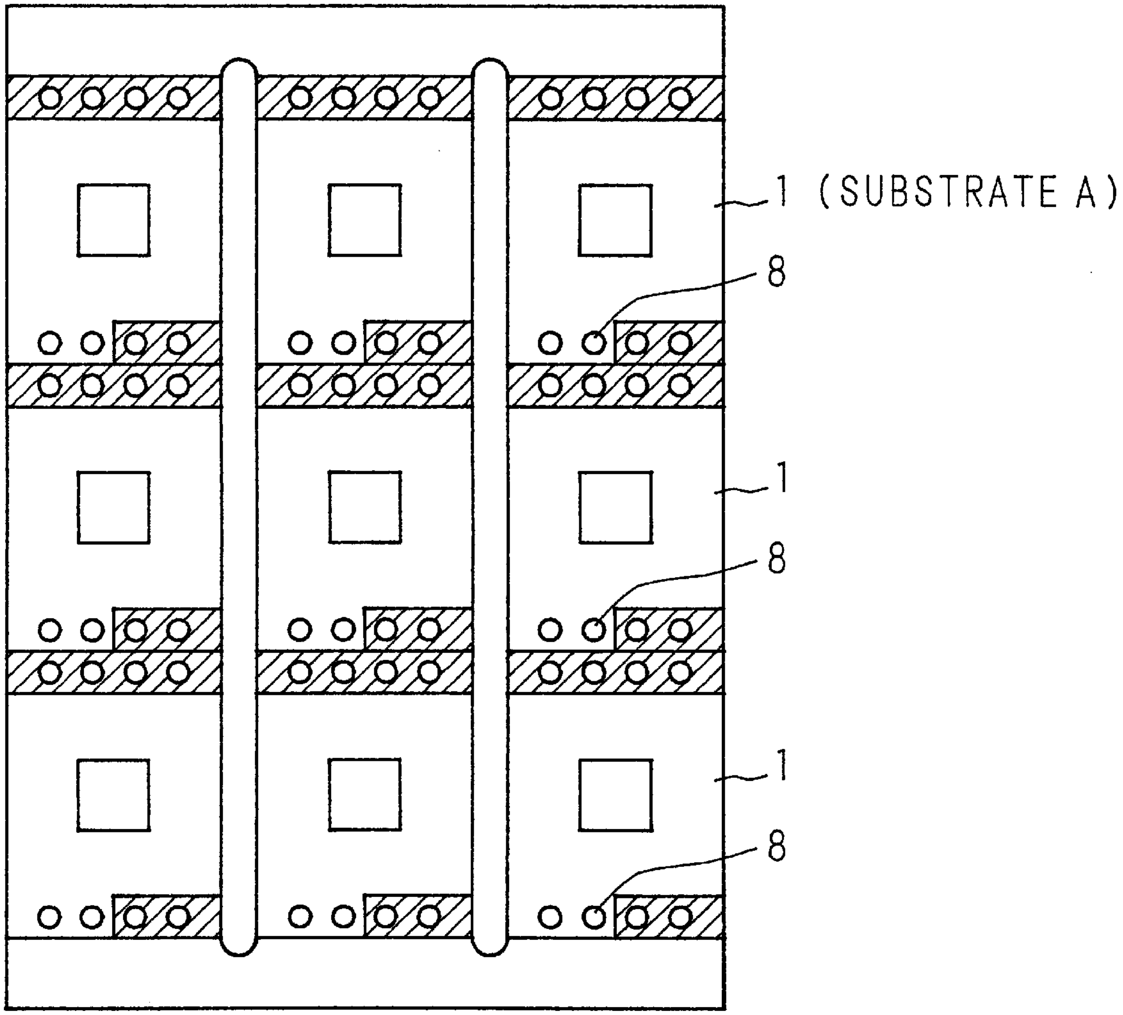
FIG. 11 is a plane view showing another aspect of the printed-coil substrates shown in FIG. 10.
Figure 12:
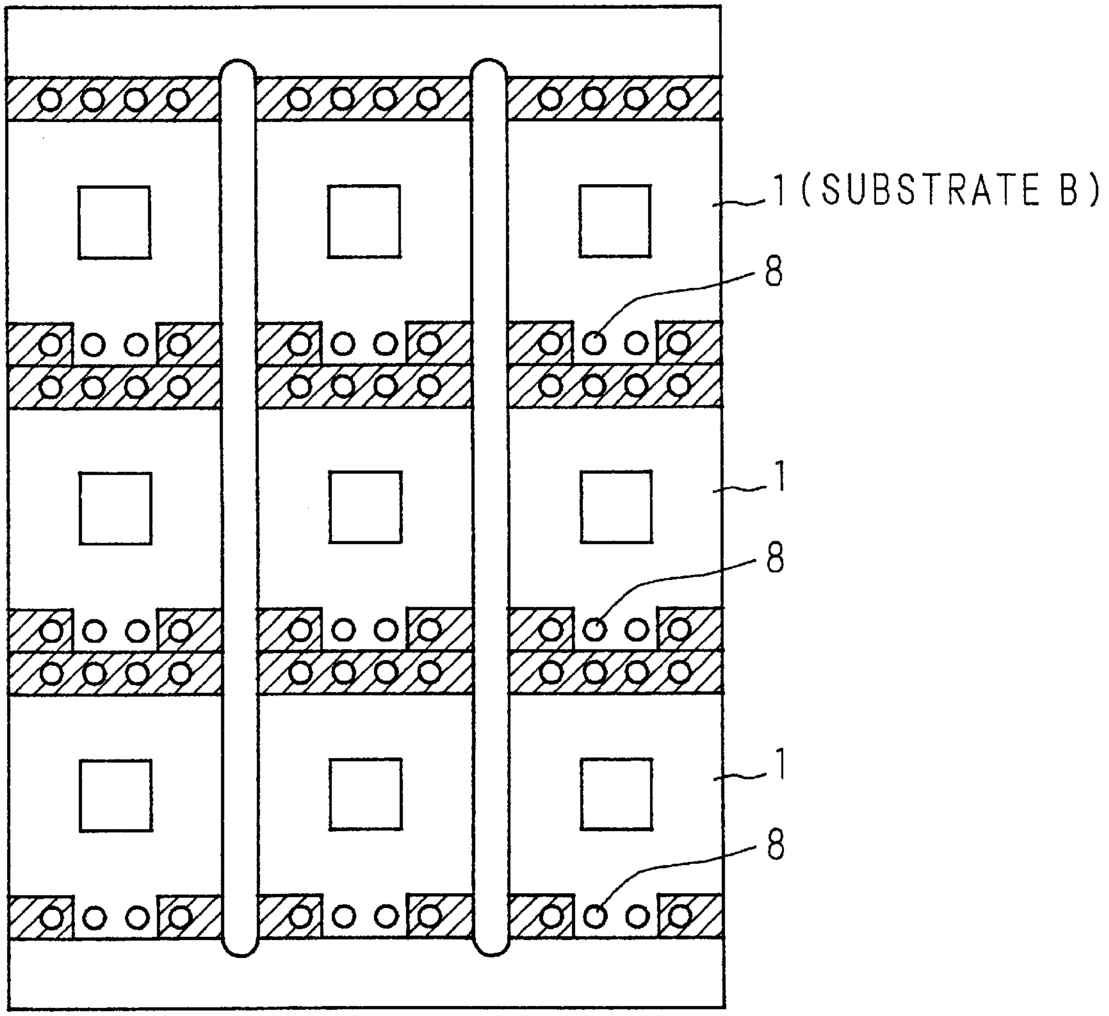
FIG. 12 is a plane view showing a further aspect of the printed-coil substrates shown in FIG. 10.
Figure 13A:
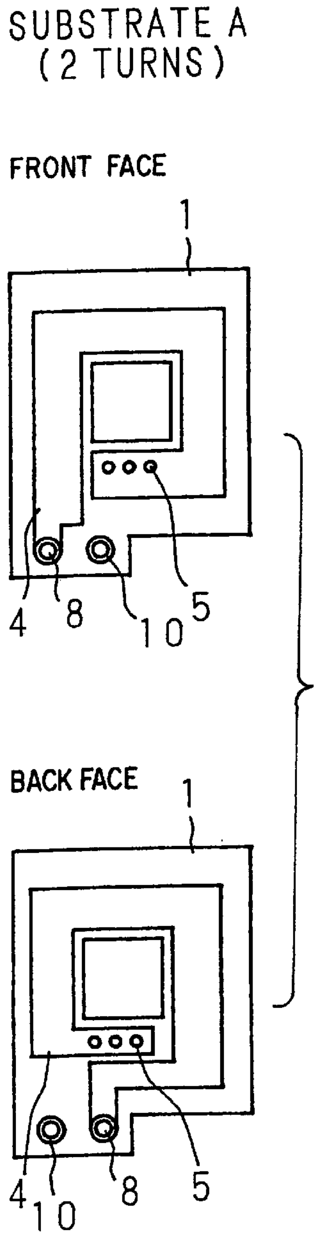
FIGS. 13A, 13B and 13C are plane views showing another example of printed-coil substrates as a constituent of the multi-layered printed-coil substrate.
Figure 13B:
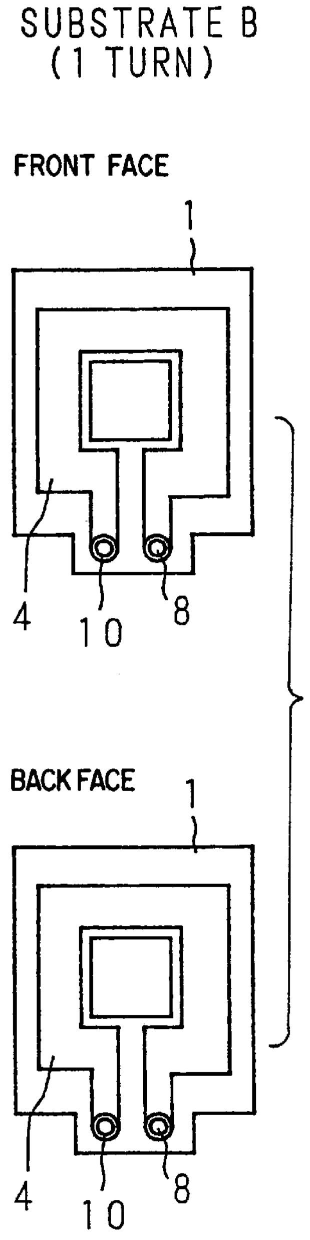
Figure 13C:
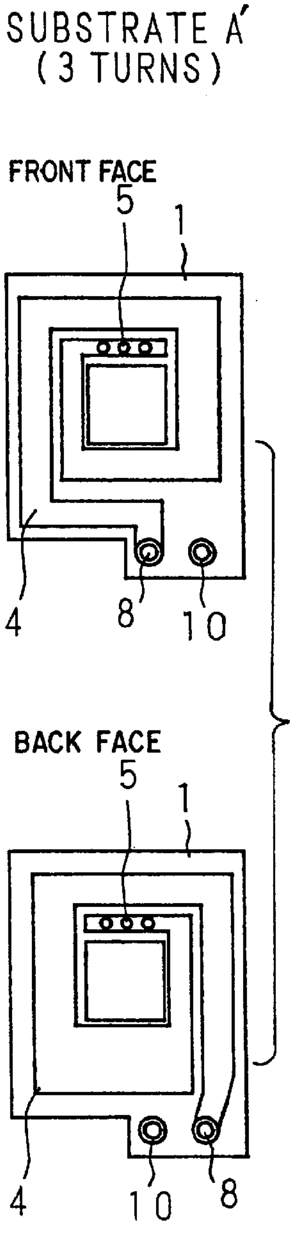

The printed-coil substrates 1 are formed in one-piece as shown in FIG. 10, and they are individually cut off along the V cut lines; the illustrated example includes nine printed-coil substrates 1 which are the same in every respect such as A1 in Table 2. The V cut lines are designed to facilitate the separation of individual substrates. The twelve substrates A1 to B6 shown in Table 2 have the shaded portions shown in FIGS. 11 and 12 cut off, and have a shape shown in FIGS. 13A, 13B, 13C. The back face of each substrate is opposite to the front face. Like reference numerals designate like reference numerals to those in FIGS. 9A, 9B, 9C. The reason for removing the shaded portions is that the pin terminals may be readily and effectively soldered to the pin pad 10. However, if no problem is likely to arise, it is unnecessary to remove the shaded portions.

Figure 14:
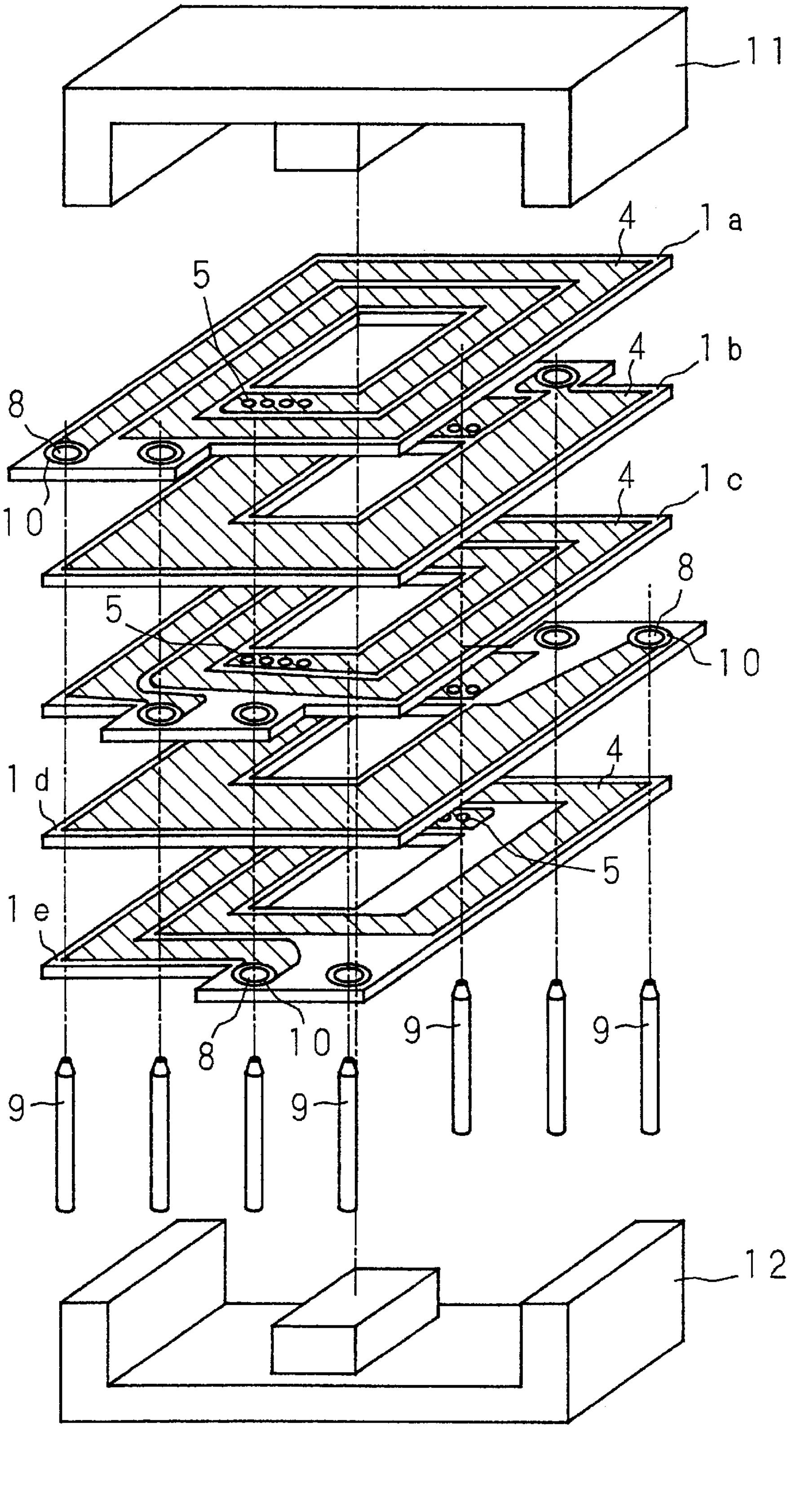
FIG. 14 is an exploded perspective view showing a prototype planar transformer.
Figure 15A:
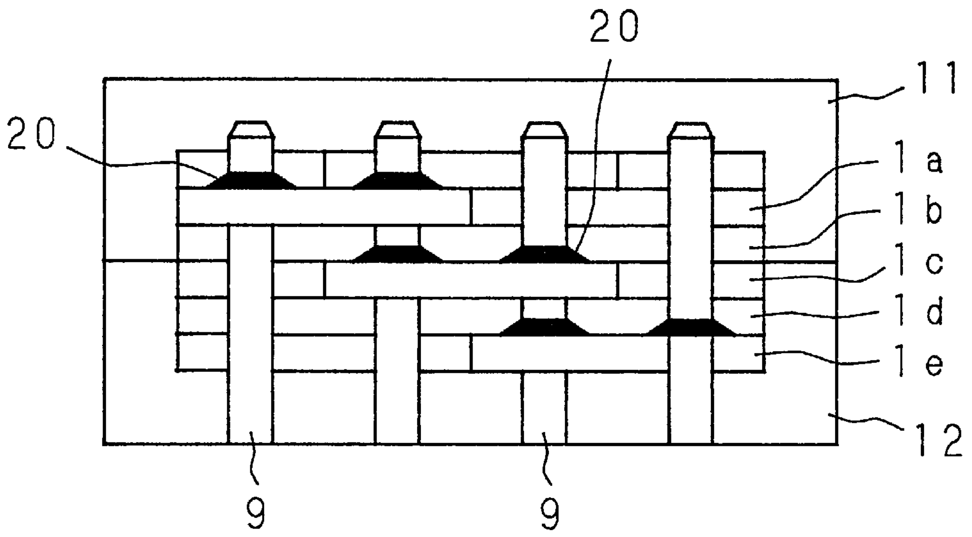
FIGS. 15A and 15B are side views showing the prototype planar transformer shown in FIG. 14.
Figure 15B:
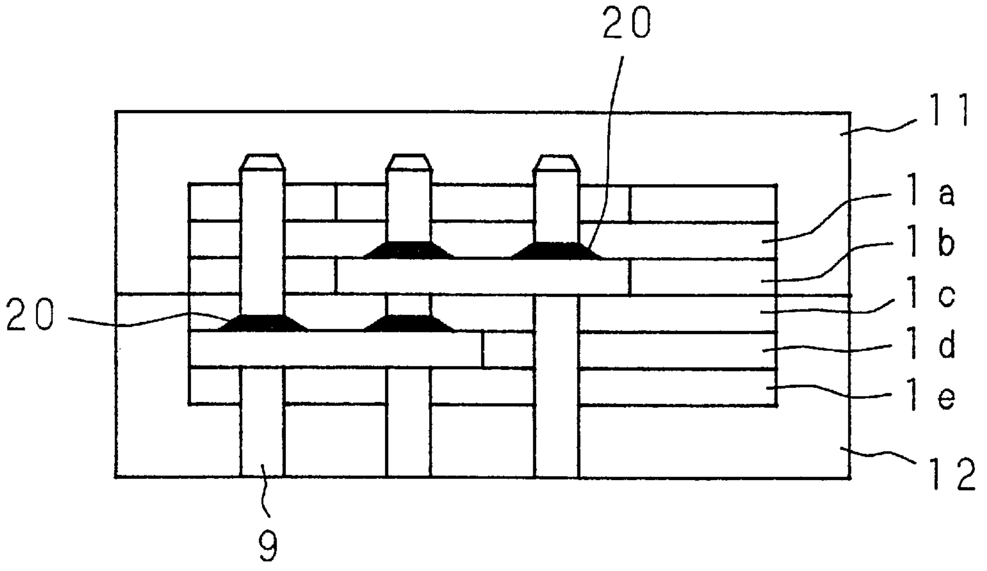

Before the commercial multi-layered printed-coil substrates are assembled on a regular manufacturing basis, prototype multi-layered printed-coil substrates are obtained as follows:

After desired substrates 1 are selected and layered to obtain a prototype multi-layered printed-coil substrate, the substrate is then provided with through-holes 8 and pin terminals 9 inserted through the through-holes 8 and sandwiched between the cores 11 and 12. In this way a planar transformer is finished as shown in FIG. 14 as an exploded perspective view. FIGS. 15A and 15B are side views showing the planar transformer. In the illustrated example, five printed-coil substrates 1*a* to 1*e* are selected and layered into a single unit. The pin terminals 9 inserted through the through-holes 8 and the pin pads 10 are soldered to each other with fillet solder 20.

Figure 16:
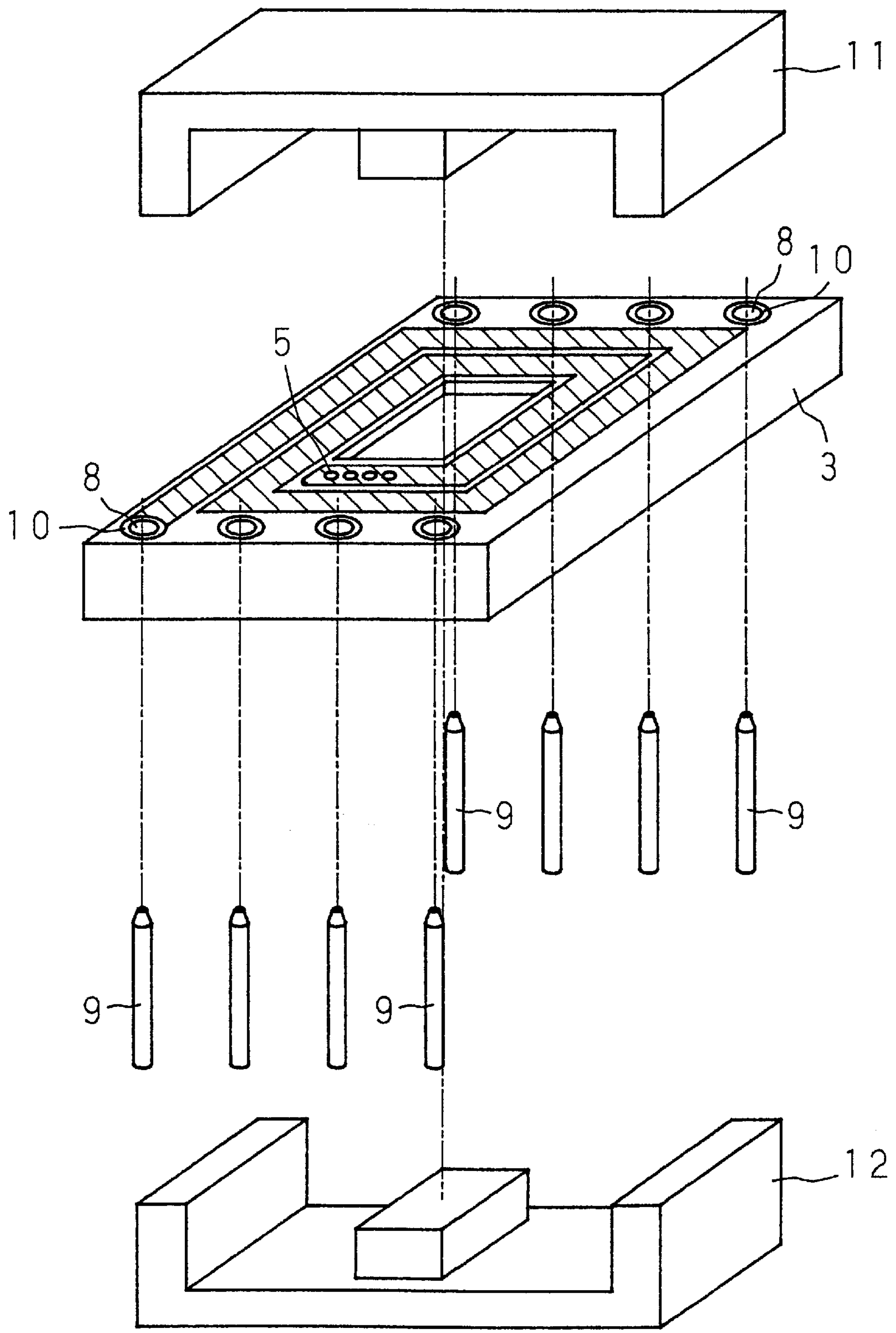
FIG. 16 is an exploded perspective view showing a commercial planar transformer.
Figure 17:
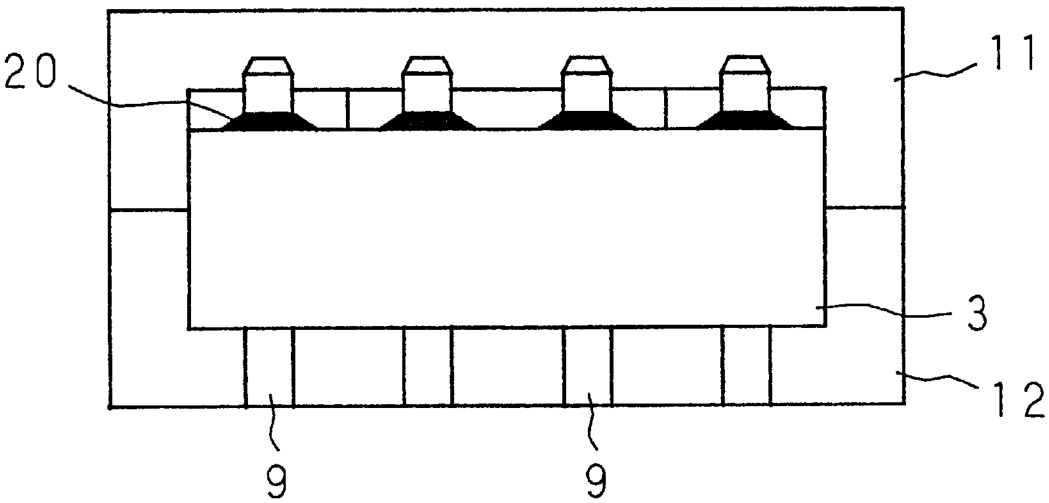
FIG. 17 is a side view showing the commercial planar transformer shown in FIG. 16.

After several multi-layered printed-coil substrates are obtained, each is tested and assessed. The manufacturers can decide the types and the order of layering by referring to the test results. Then a commercial multi-layered printed-coil substrate is assembled in the following manner:

The regular manufacturing process is started by producing several printed-coil substrates 1. First, a film used in fabricating an initial model for design use is again used, and several printed-coil substrates are formed together in one sheet as shown in FIG. 10. The used film can be used, thereby saving the production cost. The printed-coil substrates 1 formed in one sheet are individually separated in the aforementioned manner, and then are layered into a multi-layered printed-coil substrate 3. An insulating sheet containing adhesive is inserted between the adjacent substrates so that they are bonded in an insulating state. The pin terminals 9 are inserted through the through-holes 8 and the multi-layered printed-coil substrate 3 is sandwiched between the cores 11 and 12. In this way a planar transformer is finished which is shown in FIGS. 16 and 17.

The printed-coil substrates 1 are formed in one sheet and individually separated, but it is possible to use them as a prototype model without being cut away from the sheet.

In the illustrated example pin terminals 9 are used as a connector to connect one substrate to another. The clip-leads 7 shown in FIG. 7, which are cheaper than the pin terminals, can be also used as a connector.

Figures 18A, 18B:
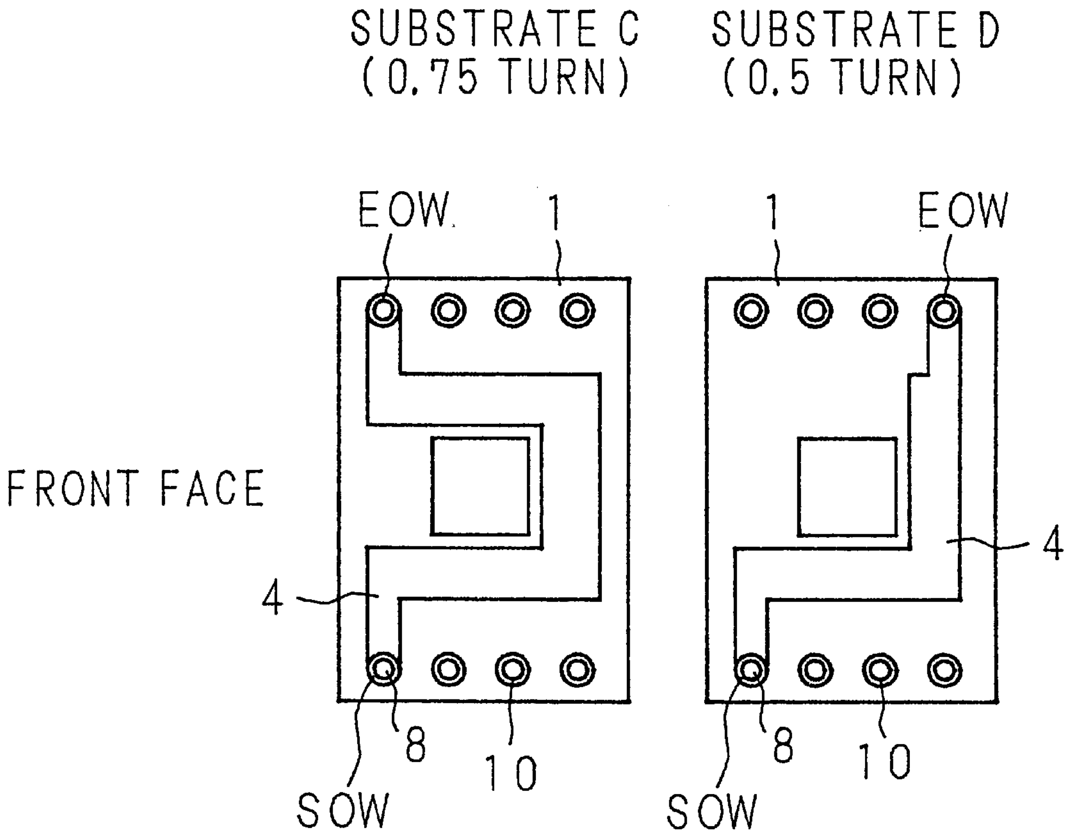
FIGS. 18A and 18B are plan views showing a printed-coil substrate having decimal number of turns.
Figure 19:
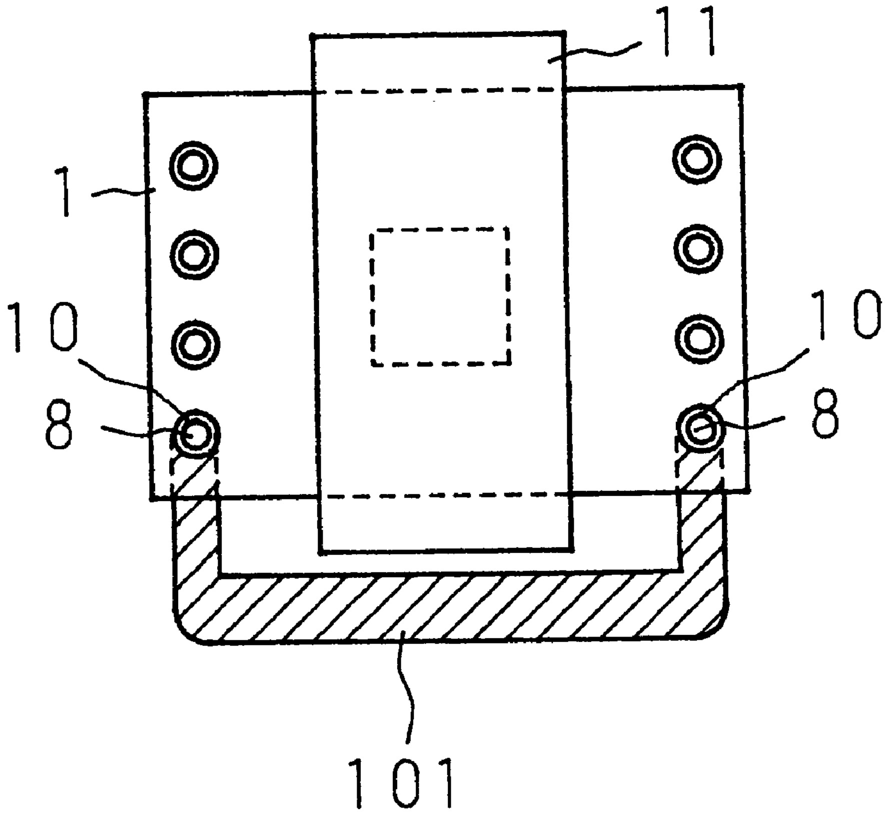
FIG. 19 PRIOR ART
FIG. 19 is a plan view showing electrical connection in a known manner.
Figure 20:
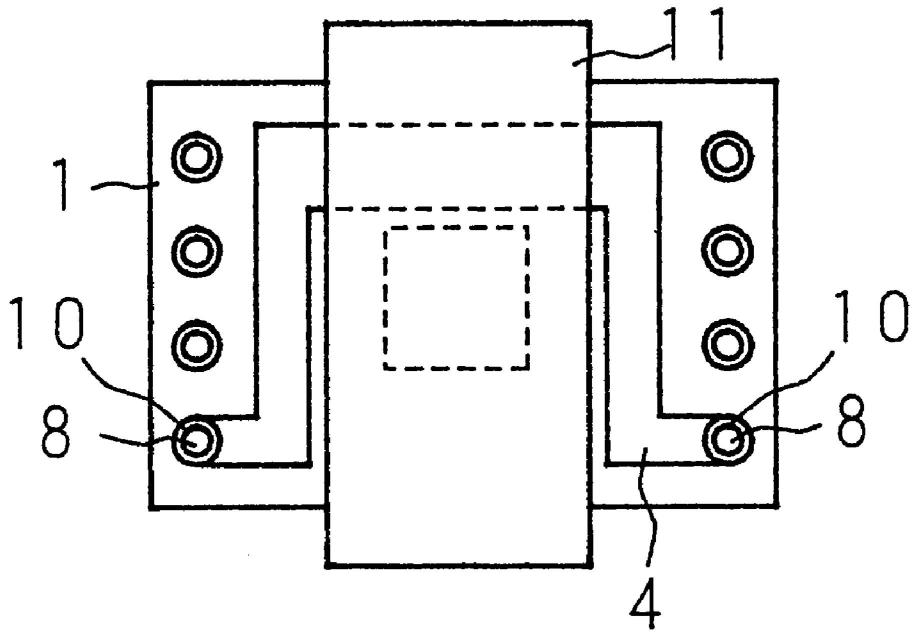
FIG. 20 is a plan view showing electrical connection according to the present invention.

In the example the number of turns is an integer but it can be 0.75, 0.5 or any other decimal figures. FIG. 18A shows a printed-coil 4 having coil turns of 0.75, and FIG. 18B shows a printed-coil 4 having coil turns of 0.5. In electrically connecting two pin pads 10 in opposite to the core 11, the printed-coil 4 having coil turns of 0.75 is advantageous in that as shown in FIG. 20 the two pin pads 10 can be electrically connected by increasing the number of turns, in contrast to the prior art example where electrical connection between the two pin pads 10 are effected by use of an external conductor 101 as shown in FIG. 19.

When the number of turns is an integer and four terminals are provided at each side of the face, there can be two types of substrates depending upon the starting end and the ending end of the winding as described above. Table 3 shows the relationship between the number of types of printed-coil substrates depending upon the starting end and the ending end of winding wherein the number of the turns is an integer. In order to withstand heavy current, it is preferred that the through-holes 8 are branched near the starting end or the ending end of the winding so as to provide a plurality of pin terminals in parallel, which increases in the number of pin terminals.

TABLE 3

| Number of Terminals | Types of the Substrates |
|---|---|
| 2 | 1 |
| 3 | 1 |
| 4 | 2 |
| 5 | 2 |
| 6 | 3 |
| 7 | 4 |

Figure 21:
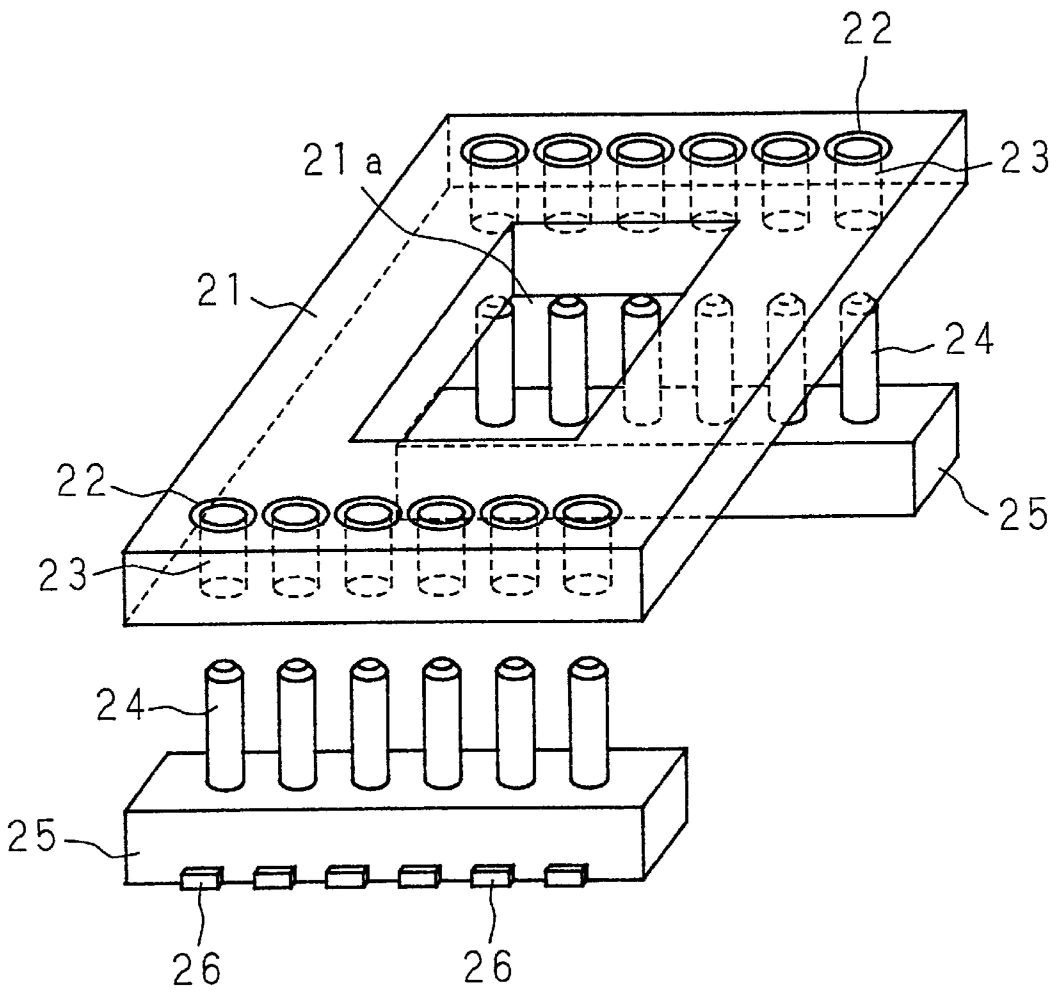
FIG. 21 is an exploded perspective view showing an example according to the present invention.

Referring to FIG. 21, printed-coil components used in electrically connecting the printed-coil substrates and an external conductor will be described:

The printed-coil substrate 21 is a rectangular thin body in which coils patterned in a conductor are layered in multi-layers. The substrate 21 is stiff sufficiently to stand by itself without any support. The substrate 21 includes a rectangular aperture 21*a* in the center, and is provided with through-holes 23 (in the illustrated example, 6 holes) at equal intervals, which are open in pin pads 22, along the opposite short sides. The substrate 21 is placed on a pair of bases 25 made of an insulating material on which pin terminals 24 of conductor (in the illustrated example, 6 pieces) are erected at equal intervals to those among the through-holes 23. Each base 25 is additionally provided with projections of conductor 26 on its side, hereinafter the projection 26 will be referred to as "side projection". Each pin terminal 24 is longer than the length of the through-hole 23, preferably about two times long.

Figure 22A:
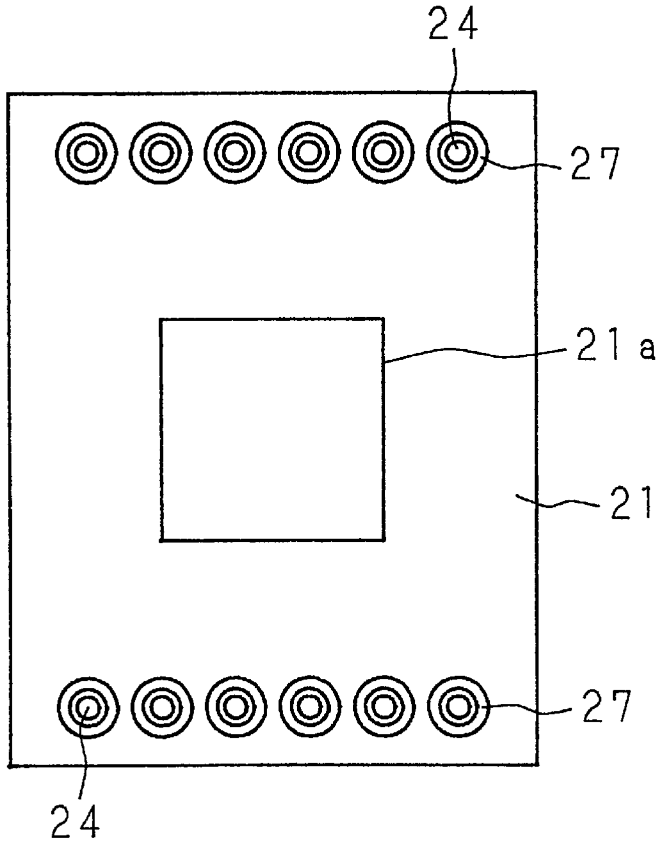
FIGS. 22A, 22B and 22C are respectively a plane view, a front view and a side view showing the example shown in FIG. 14.
Figure 22C:
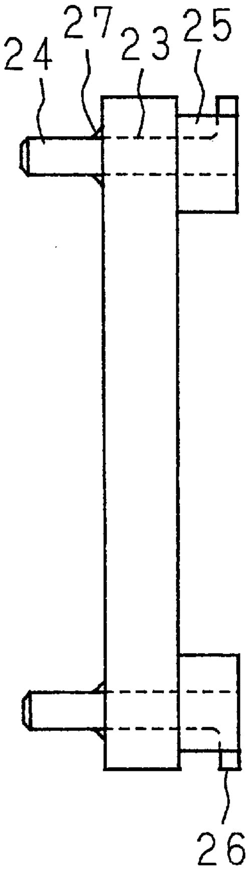
Figure 22B:
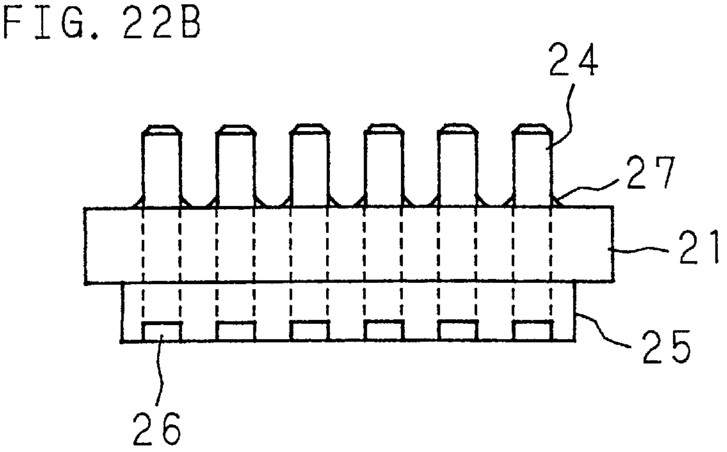

The printed-coil component will be assembled in the following manner:

Referring to FIGS. 22A, 22B and 22C, which are respectively a plane view, a front view and a side view showing a finished assembly, the substrate 21 and the bases 25 are positioned by aid of a jig such that the through-holes 23 of the substrate 21 and the pin terminals 24 on the bases are aligned. The pin terminals 24 are inserted through the through-holes 23 until the substrate 21 comes into abutment with the bases 25, and are soldered thereto so as to secure electrical connection therebetween, wherein the reference numeral 27 denotes a solder fillet. As is evident from FIGS. 22B and 22C, half of the pin terminals 24 project above the top surface of the substrate 21.

Figure 23:
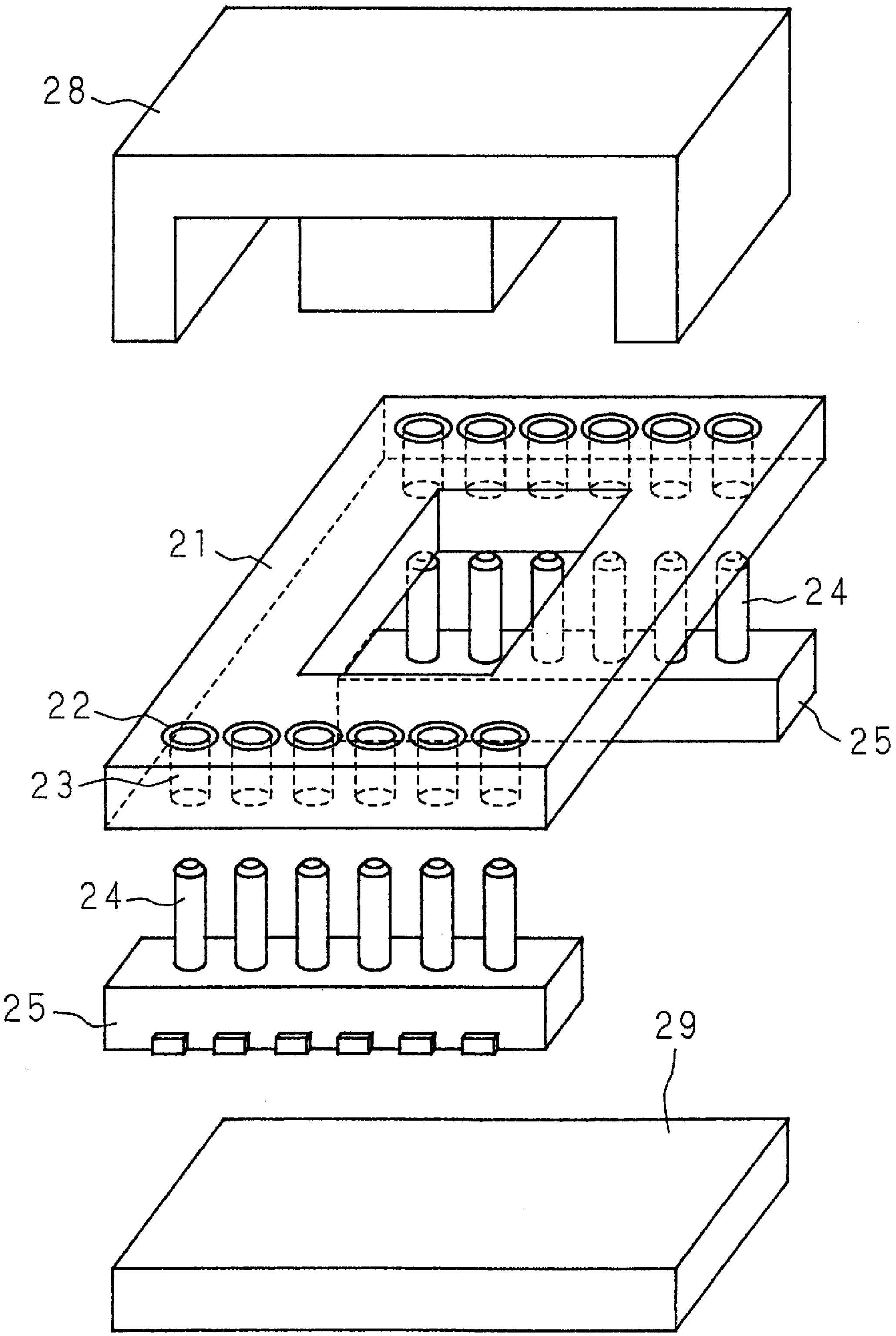
FIG. 23 is an exploded perspective view showing a planar transformer using a printed-coil component according to the present invention.
Figure 24A:
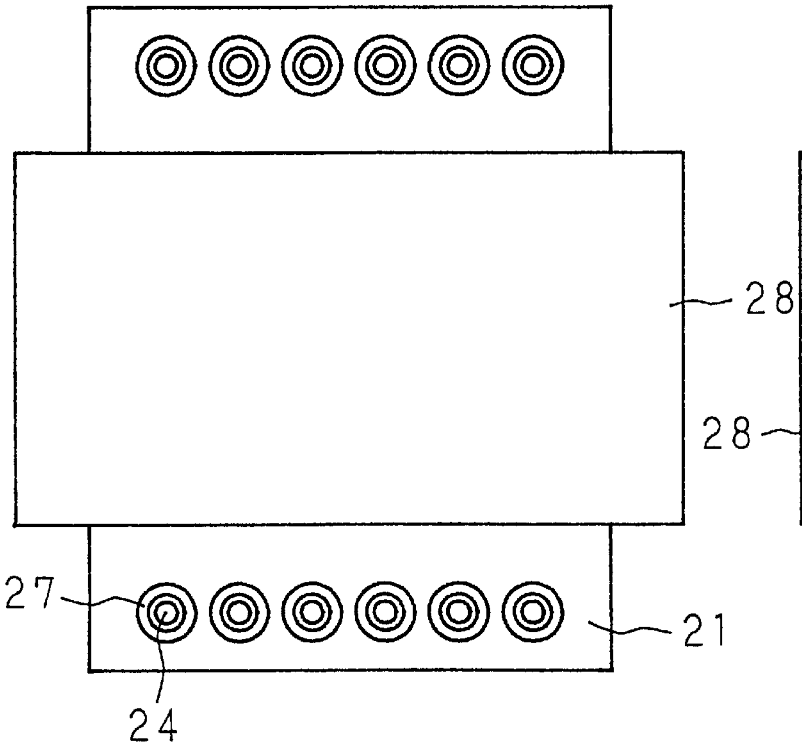
FIGS. 24A, 24B and 24C are respectively a plan view, a front view and a side view showing the planar transformer using the printed-coil component shown in FIG. 23.
Figure 24C:
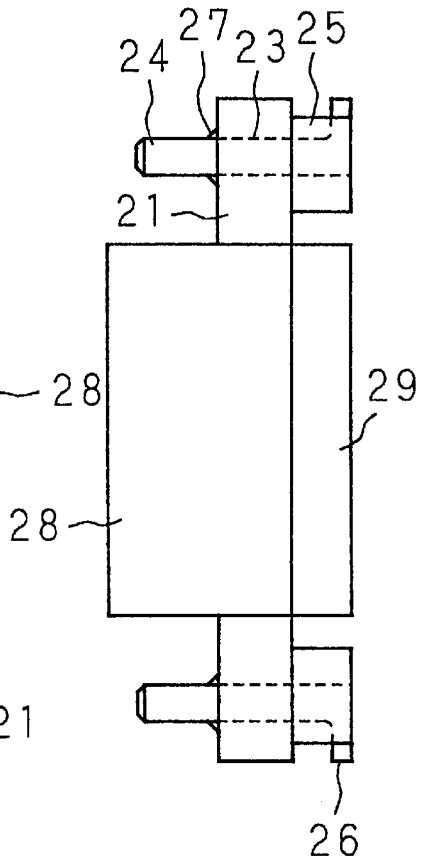
Figure 24B:
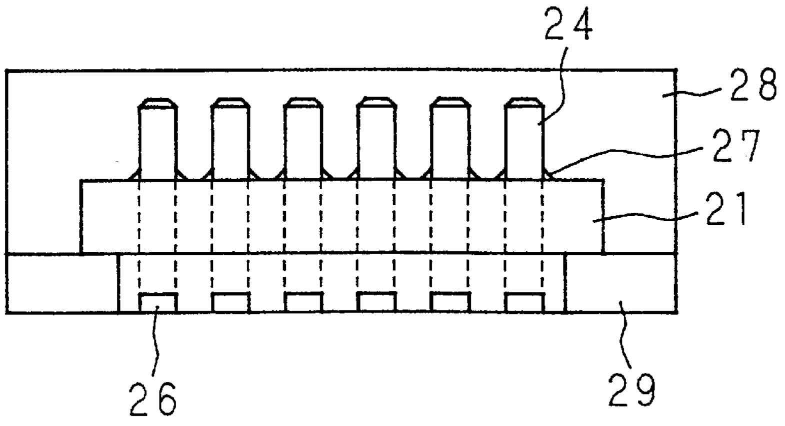

The assembly obtained in this way is sandwiched between the E-shaped core and the I-shaped cores. In this way a transformer for use in a switched mode power supply circuit and a choke coil are obtained. FIG. 23 is an exploded perspective view showing a finished transformer, and FIGS. 24A, 24B and 24C are respectively a plane view, a front view and a side view showing the transformer in an assembled state. In FIGS. 23 and 24 like reference numerals designate like elements and components to those in FIGS. 21 and 22, and a description of them will be omitted for simplicity.

In FIGS. 23 and 24 the printed-coil component is sandwiched between the ferrite cores 28 and 29; more specifically, the E-shaped core 28 having projections in the middle and each edge, and the core 29 is a rectangular flat I-shaped body. The middle projection of the core 28 is inserted through the aperture 21*a* until the three projections thereof come into abutment with the core 29. In this way the printed-coil component and the cores 28, 29 are integrated into a single body, which provides a transformer.

Figure 25A:
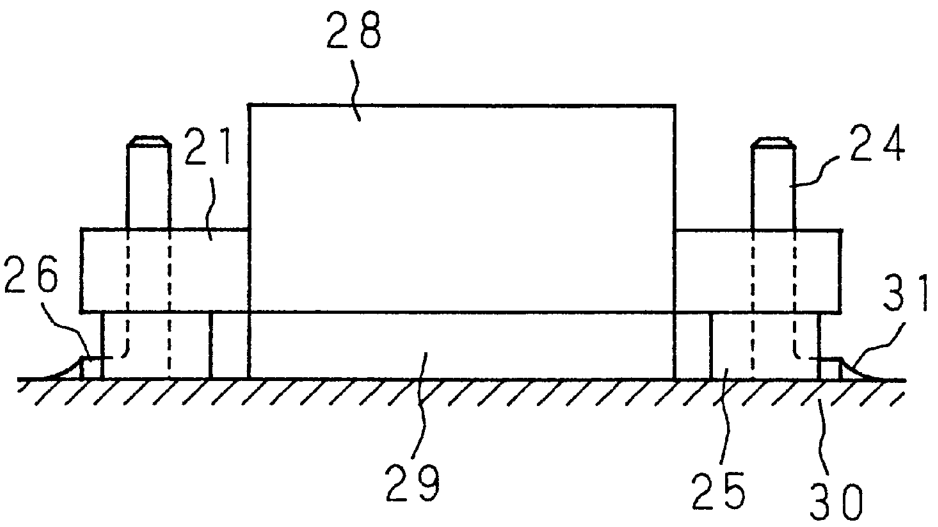
FIGS. 25A and 25B are schematic side views showing two examples of the manner in which the transformer is mounted on a circuit board.
Figure 25B:
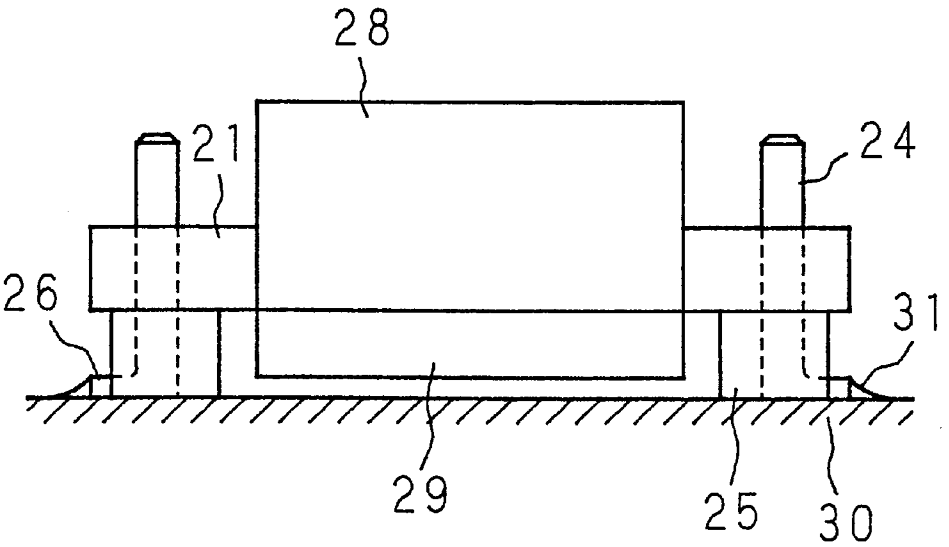

The transformer and a mounting base are electrically connected in the following manner:

Referring to FIGS. 25A and 25B, wherein like reference numerals designate like elements and components to those in FIGS. 23 and 24:

Each side projection 26 electrically connected to the pin terminals 24 is soldered to the mounting base 30 with solder fillets 31, thereby securing electrical connection between the printed-coil component and the mounting base 30. The example shown in FIG. 25A has the bases 25 having a shortened height so that the ferrite core 29 is placed in contact with the mounting base 30. This arrangement is advantageous in that heat generated from the ferrite core is allowed to dissipate through the mounting base 30. In FIG. 25B the height of the bases 25 are adjusted so that the bottom of the ferrite core 29 is maintained slightly above the mounting base 30, thereby ensuring that the ferrite core 29 and the mounting base 30 are insulated from each other.

Figure 1A:
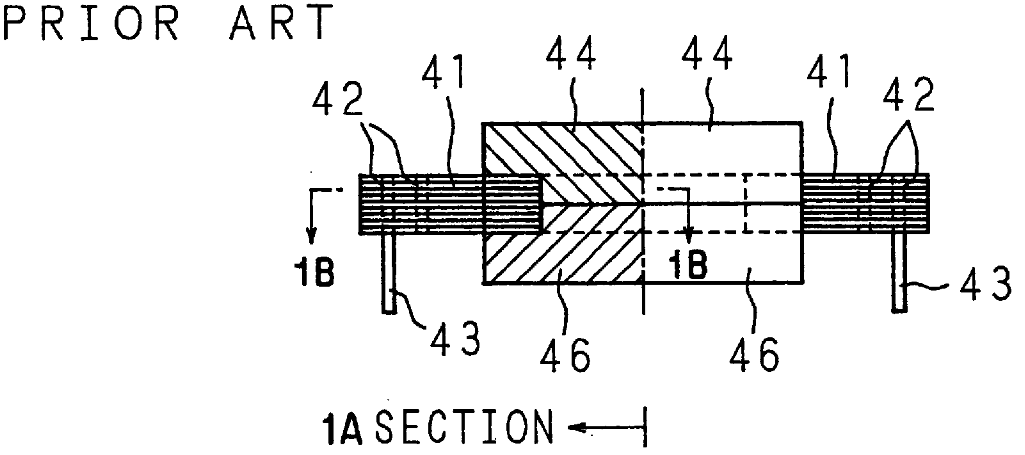
FIG. 1A PRIOR ART
FIGS. 1A to 1C are respectively a front view, a plane view and a side view showing a known planar magnetic component.
Figure 1B:
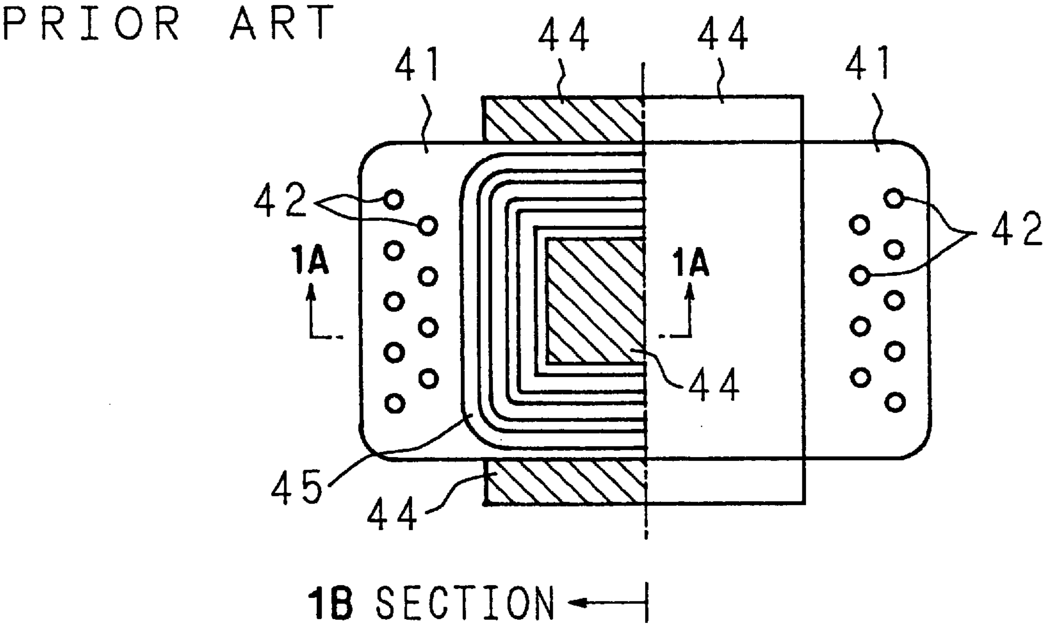
FIG. 1B PRIOR ART
Figure 1C:
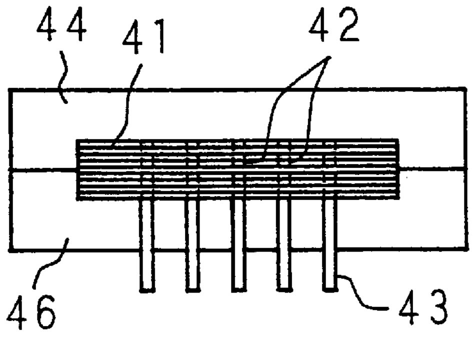
FIG. 1C PRIOR ART
Figure 2:
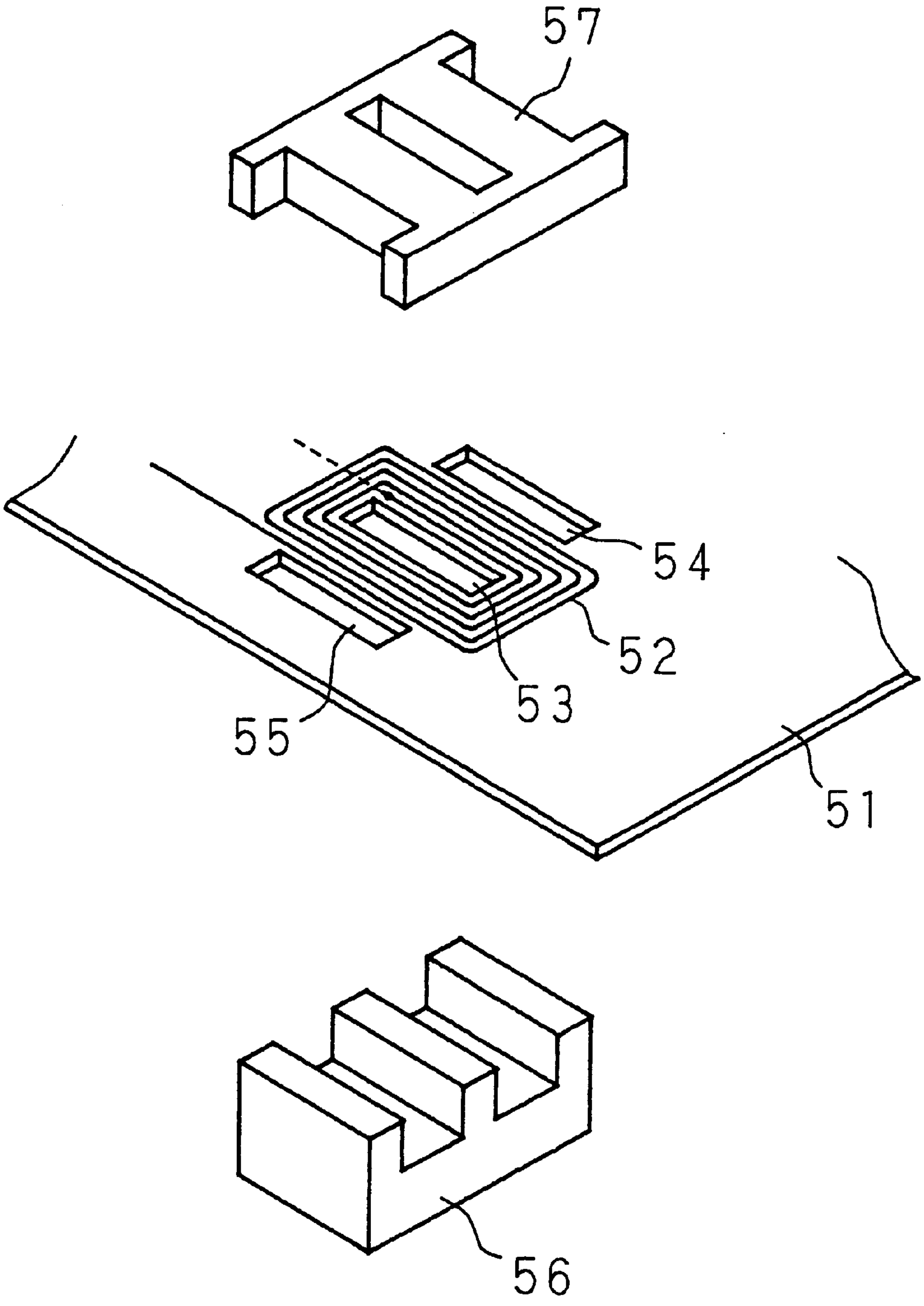
FIG. 2 PRIOR ART
FIG. 2 is an exploded perspective view showing another known planar magnetic component.
Figure 3:
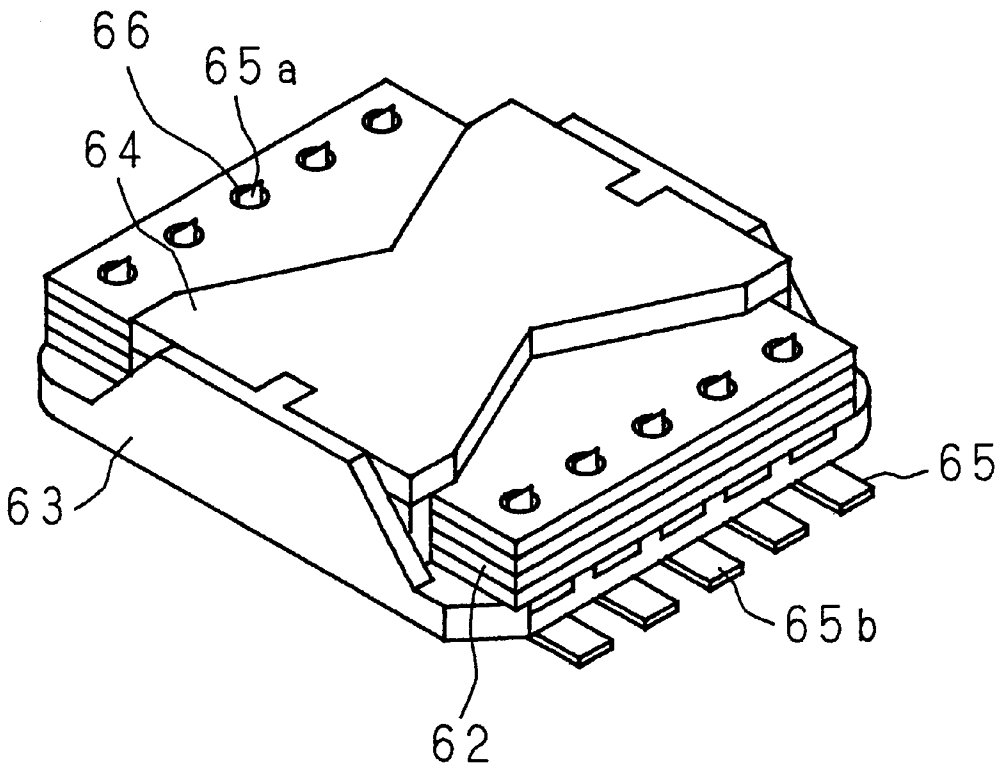
FIG. 3 PRIOR ART
FIG. 3 is a perspective view showing a further known planar magnetic component.
Figure 4:
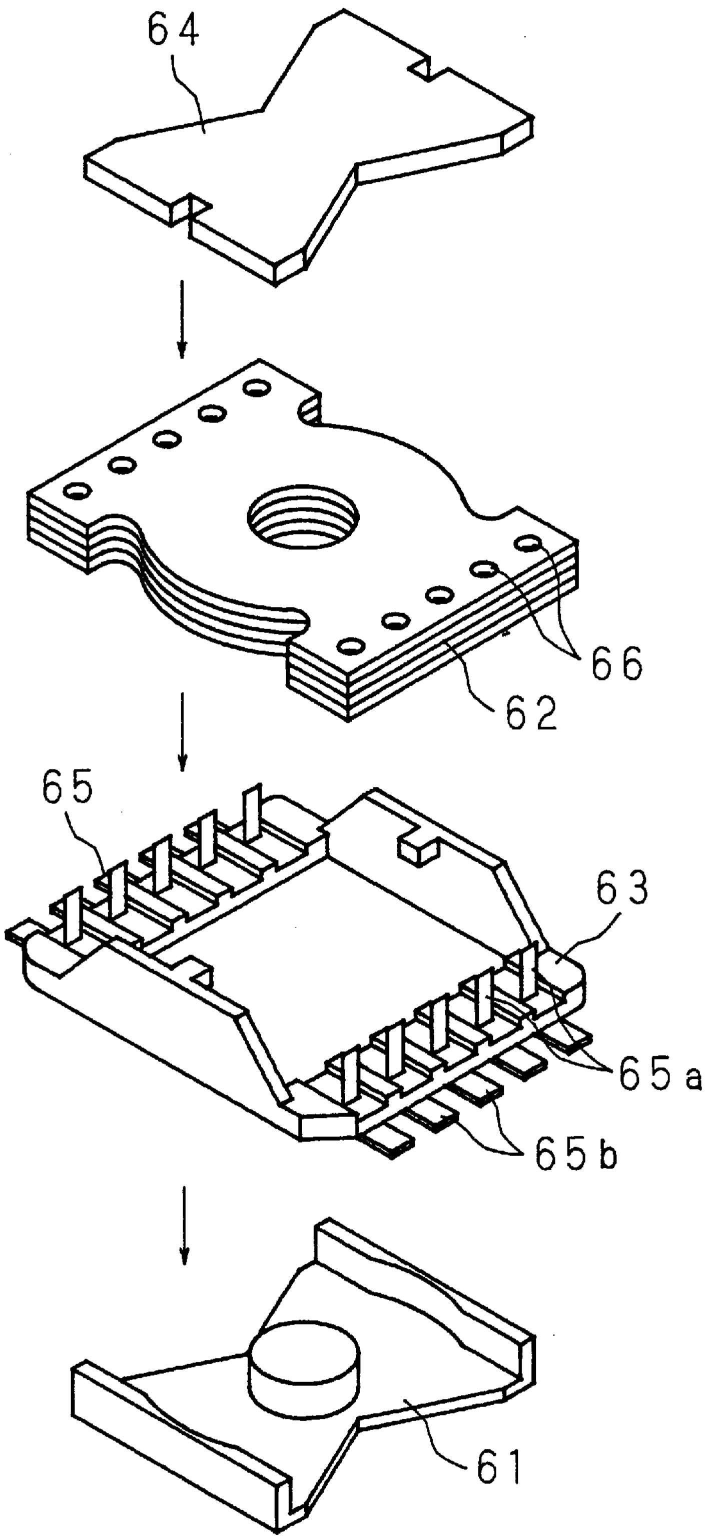
FIG. 4 PRIOR ART
FIG. 4 is an exploded perspective view showing the known planar magnetic component shown in FIG. 3.

According to the present invention, the printed-coil substrate 21 and the cores can be easily assembled by aligning the pin terminals 24 with the through-holes 23 by use of a simple jig in contrast to the prior art in which pin terminals 43 (FIG. 1) are upright pressed into the through-holes 42. After the intervals of the pin terminals 24 on each base 25 are fixed, it is no longer necessary to care about the number of them and the distance of opposite pin terminals 24 on the bases 25. Thus the flexibility of design is ensured unlike the prior art example shown in FIGS. 3 and 4 using the base 63 where not only the intervals of the pin terminals 65 but also the number of the pin terminals 65 and the distance of opposite pin terminals 65 are fixed. The flexibility of design reduces costs incurred not only in procuring raw material but also in manufacturing.

Figure 26:
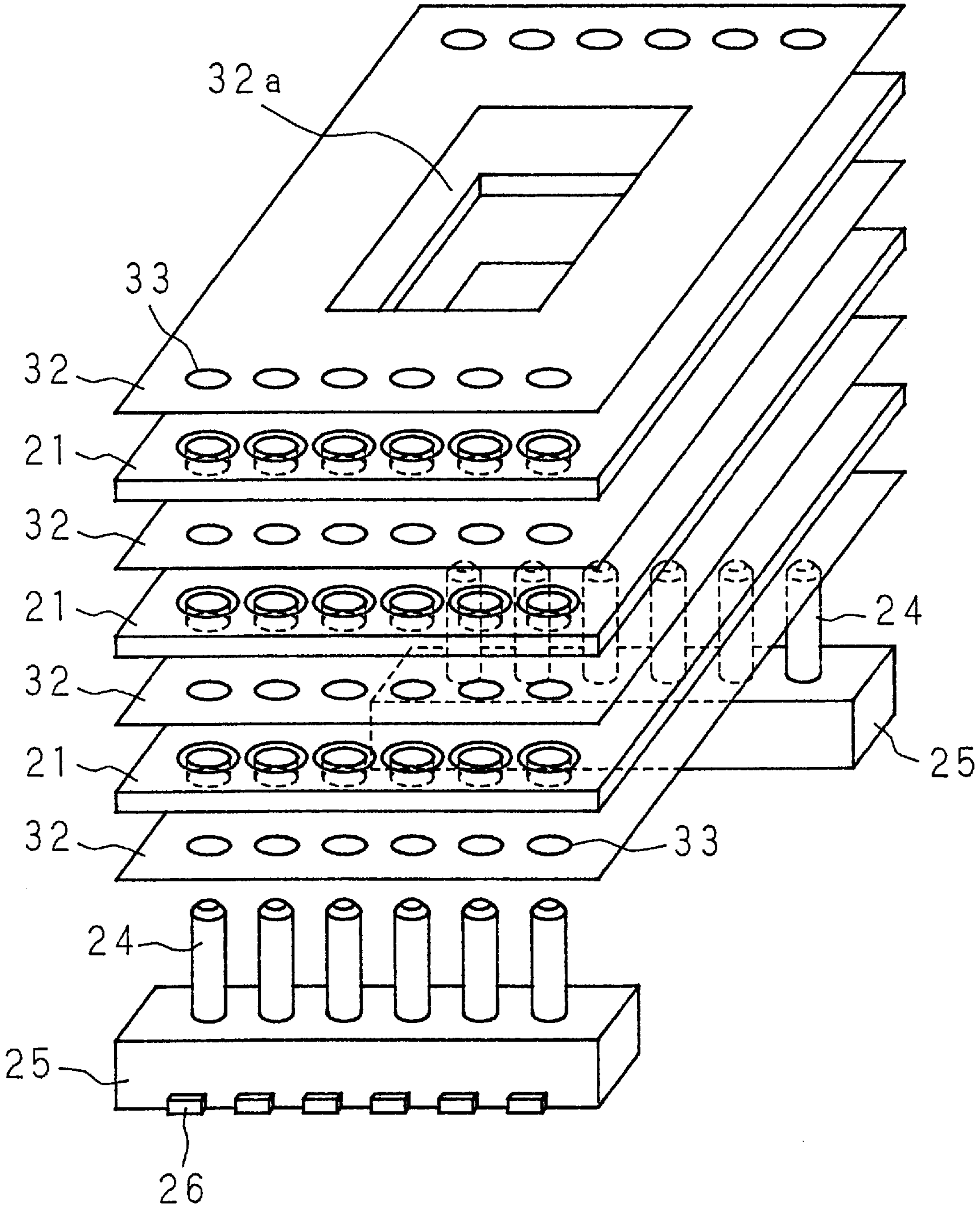
FIG. 26 is an exploded perspective view showing another example of a printed-coil component according to the present invention.

Referring to FIG. 26, a modified version will be described:

The illustrated example includes three printed-coil substrates 21 and four insulating sheets 32 alternately layered, wherein the patterned coils are formed on both faces of each substrate. Each insulating sheet 32 includes a rectangular aperture 32*a* in the center corresponding to the aperture 21*a*, and additionally, through-holes 33 along each short side, corresponding to the through-holes 23 of the substrate 21. The printed-coil substrates 21 are electrically connected to each other in the same manner as described above, that is, by using the bases 25, inserting the erected pin terminals 24 thereon through the through-holes 23 and 33, and soldering the pin terminals 24 to and around the through-holes 23 and 33. In general, the production cost rises in proportion to the number of layers of printed-coil patterns formed on the substrates, wherein the rise is exponential functional. When a number of printed-coil patterns are to be used, it is preferred to distribute the patterns into several substrates, and layer them with a single or several insulating sheets interlocated between the adjacent substrates as shown in FIG. 26.

Figure 27A:
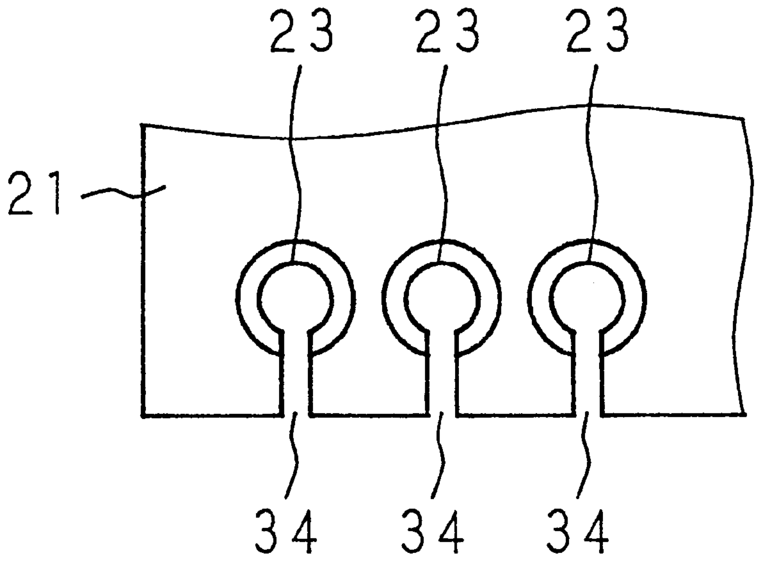
FIGS. 27A and 27B are a partial plane view showing a printed-coil substrate having slits, and a partial side view showing an assembly of the slitted substrate, respectively.
Figure 27B:
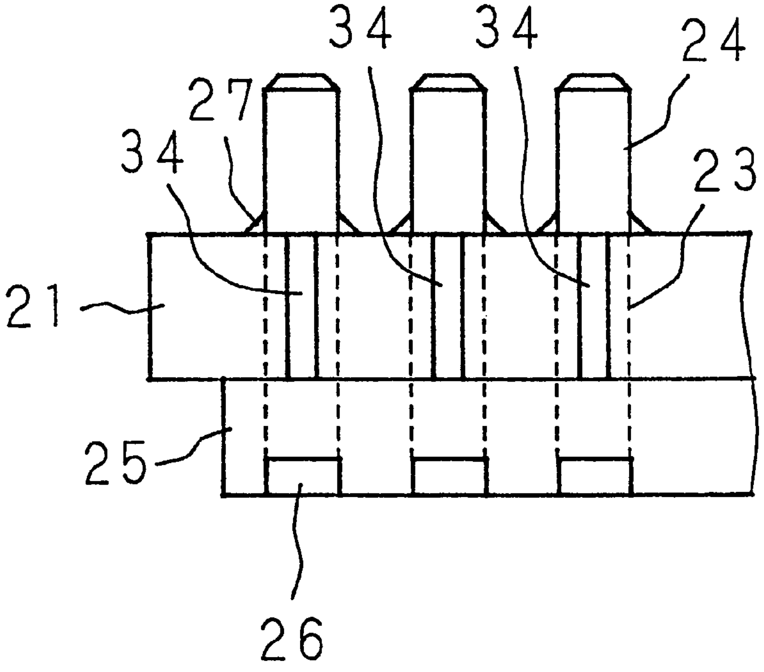

Referring to FIG. 27, a modified version of the printed-coil component according to the present invention will be described, wherein like reference numerals designate like elements and components to those in FIG. 21:

The printed-coil substrate 21 is provided with slits 34 leading to each of the through-holes 23 and being open therein. The slits 34 are useful for visually inspecting the state of bond between the pin terminals 24 and the through-holes 23, thereby contributing to quality control. The pin terminals 24 can be exactly positioned by reliance upon the through-holes 23. To achieve this convenience, the width of each slit 34 should be narrower than the diameter of the pin terminal 24.

In the examples of printed-coil components described above, the shape and location of the pin terminals 24, the shape of the through-holes 23 in the printed-coil substrate 21, the number of pattern layers, the number of printed-coil substrates to be layered, and the shape of ferrite cores are not limited to the illustrated examples but they can be appropriately selected or determined.

As this invention may be embodied in several forms without departing from the spirit of essential characteristics thereof, the examples described herein are illustrative and not restrictive, since the scope of the invention is defined by the appended claims rather than by the description preceding them, and all change that fall within metes and bounds of the claims, or equivalent of such metes and bounds thereof are therefore intended to be embraced by the claims.

What is claimed is:

1. A process of producing a multi-layered printed-coil substrate comprised of printed-coil substrates each having at least one coil pattern, the process comprising the steps of:

preparing several first printed-coil substrates having individually different coil patterns;

producing a plurality of different first multi-layered printed-coil substrates that each include layered and ordered printed-coil substrates selected from said first printed-coil substrates;

testing each of said first multi-layered printed-coil substrates and selecting one of said first multi-layered printed-coil substrates as a desired multi-layered printed-coil substrate after the testing;

producing a second multi-layered printed-coil substrate that includes a plurality of second printed-coil substrates that are ordered and layered the same as said first printed-coil substrates in the desired prototype multi-layered printed-coil substrate.

2. The process according to claim 1, wherein said first printed-coil substrates each possess opposite faces, one of said faces of each first printed-coil substrate provided with said coil pattern.

3. The process according to claim 1, wherein the coil patterns on said first printed-coil substrates possess a number of turns, a coil shape, a coil width and a coil thickness, said first printed-coil substrates differing from each other with respect to at least one of the number of turns, the coil shape, the coil width and the coil thickness.

4. The process according to claim 1, wherein each of said first printed-coil substrates possesses opposite faces each provided with a coil pattern, and said first printed-coil substrates provided with through-holes for electrical connection between the coil patterns on both faces of said first printed-coil substrates.

5. The process according to claim 1, wherein each of said first printed-coil substrates is provided with connectors for electrical connection with an other of said first printed-coil substrates.

6. The process according to claim 5, wherein the connector is a pin terminal, and each of said first printed-coil substrates is provided with through-holes for insertion of the pin terminal.

7. The process according to claim 1, wherein said second printed-coil substrates used to produce said second multi-layered printed-coil substrate are formed using a pattern film, said pattern film being used in preparing said first printed-coil substrates.

8. The process according to claim 1, wherein said first printed-coil substrates each possess opposite faces and have a coil pattern on both of said faces.

9. The process according to claim 1, wherein each of said first printed-coil substrates is provided with connectors for electrical connection between said first printed-coil substrates and an external conductor.

10. A process of producing a multi-layered printed-coil substrate comprised of printed-coil substrates having coil patterns, the process comprising the steps of:

preparing several first printed-coil substrates having individually different coil patterns and connectors formed as clip-leads with terminals connected to the clip-leads;

selecting a plurality of said first printed-coil substrates;

layering the selected printed-coil substrates to obtain a first multi-layered printed-coil substrate;

forming a plurality of second printed-coil substrates that are the same as said selected printed-coil substrates used in said first multi-layered printed-coil substrate; and layering said second printed-coil substrates to obtain a second multi-layered printed-coil substrate that is the same as said first multi-layered printed-coil substrate.

* * * * *